United States Patent
Kim et al.

(10) Patent No.: US 11,488,506 B2
(45) Date of Patent: Nov. 1, 2022

(54) DISPLAY DEVICE

(71) Applicant: Samsung Display Co., Ltd., Yongin-Si (KR)

(72) Inventors: Hwi Kim, Suwon-si (KR); Jeongkuk Kim, Suwon-si (KR); Kyu Hwan Hwang, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/213,718

(22) Filed: Mar. 26, 2021

(65) Prior Publication Data

US 2022/0028317 A1 Jan. 27, 2022

(30) Foreign Application Priority Data

Jul. 21, 2020 (KR) .......................... 10-2020-0090307

(51) Int. Cl.
*G09G 3/20* (2006.01)
*H01L 27/32* (2006.01)

(52) U.S. Cl.
CPC .......... *G09G 3/20* (2013.01); *H01L 27/3244* (2013.01); *G09G 2300/0443* (2013.01); *G09G 2310/0267* (2013.01); *G09G 2310/0275* (2013.01); *H01L 27/3218* (2013.01)

(58) Field of Classification Search
CPC ......... G09G 3/3208; G09G 2310/0264; G09G 2320/0233; H01L 27/3262; H01L 51/5206; H01L 51/5221
See application file for complete search history.

(56) References Cited

U.S. PATENT DOCUMENTS

| 10,380,938 | B2 | 8/2019 | Su | |
|---|---|---|---|---|
| 2008/0068309 | A1* | 3/2008 | Kwak | ................. H01L 27/3276 345/82 |
| 2009/0213288 | A1* | 8/2009 | Chen | ..................... G02F 1/1303 349/43 |
| 2009/0225047 | A1* | 9/2009 | Lee | ..................... G02F 1/13338 345/173 |
| 2011/0248968 | A1 | 10/2011 | Suh | |
| 2013/0265069 | A1* | 10/2013 | Deng | ..................... G09G 3/006 324/750.3 |
| 2014/0104251 | A1* | 4/2014 | Zhang | ................. G09G 3/3611 345/205 |

(Continued)

FOREIGN PATENT DOCUMENTS

| CN | 110444125 | 11/2019 |
|---|---|---|
| EP | 3859786 | 8/2021 |

(Continued)

OTHER PUBLICATIONS

Extended European Seach Report—European Application No. 21186053.1 dated Dec. 17, 2021.

*Primary Examiner* — Shaheda A Abdin
(74) *Attorney, Agent, or Firm* — Cantor Colburn LLP

(57) ABSTRACT

A display device includes a display panel in which a first display region and a second display region adjacent to the first display region are defined. The display panel includes main pixels disposed in the first display region, first sub-pixels disposed in a first sub-region of the second display region, and second sub-pixels disposed in a second sub-region of the second display region and which have a different pixel structure from the main pixels.

23 Claims, 18 Drawing Sheets

(56) References Cited

U.S. PATENT DOCUMENTS

| | | | |
|---|---|---|---|
| 2015/0014686 A1* | 1/2015 | Lv | G09G 3/006 |
| | | | 257/48 |
| 2018/0047799 A1 | 2/2018 | Lim et al. | |
| 2019/0064256 A1* | 2/2019 | Wang | H01L 27/1262 |
| 2019/0152129 A1 | 5/2019 | Franklin et al. | |
| 2021/0013298 A1 | 1/2021 | Her et al. | |

FOREIGN PATENT DOCUMENTS

| KR | 102037727 B1 | 10/2019 |
|---|---|---|
| WO | 2019199139 | 10/2019 |
| WO | 2020067611 | 4/2020 |

* cited by examiner

DISPLAY DEVICE

This application claims priority to Korean Patent Application No. 10-2020-0090307, filed on Jul. 21, 2020, and all the benefits accruing therefrom under 35 U.S.C. § 119, the content of which in its entirety is herein incorporated by reference.

BACKGROUND

The present disclosure herein relates to a display device, and more particularly, to a display device having an enlarged display region.

Various electronic apparatuses used for multimedia devices such as a television, a mobile phone, a tablet computer, a navigation system, a game console are being developed.

In response to the demand in the market, research has been conducted to reduce a region in which an image is not displayed in an electronic apparatus. At the same time, research has been conducted to enlarge a display region in which an image is displayed to a user.

SUMMARY

The present disclosure provides a display device having an enlarged display region by reducing the width of a bezel region.

An embodiment of the inventive concept provides a display device including display panel in which a first display region and a second display region adjacent to the first display region are defined. In an embodiment, the display panel includes main pixels disposed in the first display region, first sub-pixels disposed in a first sub-region of the second display region, and second sub-pixels disposed in a second sub-region of the second display region and which have a different pixel structure from the main pixels.

In an embodiment, the display device includes a display panel in which a first display region and a second display region adjacent to the first display region are defined. In an embodiment, the display panel includes main pixels disposed in the first display region, first sub-pixels disposed in a first sub-region of the second display region, and second sub-pixels disposed in a second sub-region of the second display region. In an embodiment, each of the first sub-pixels includes a first sub-pixel driving circuit and a first sub-light emitting element electrically connected to the first sub-pixel driving circuit, and each of the second sub-pixels includes a second sub-pixel driving circuit and a second sub-light emitting element electrically connected to the second sub-pixel driving circuit. In an embodiment, the first sub-pixel driving circuit and the second sub-pixel driving circuit have different pixel structures.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
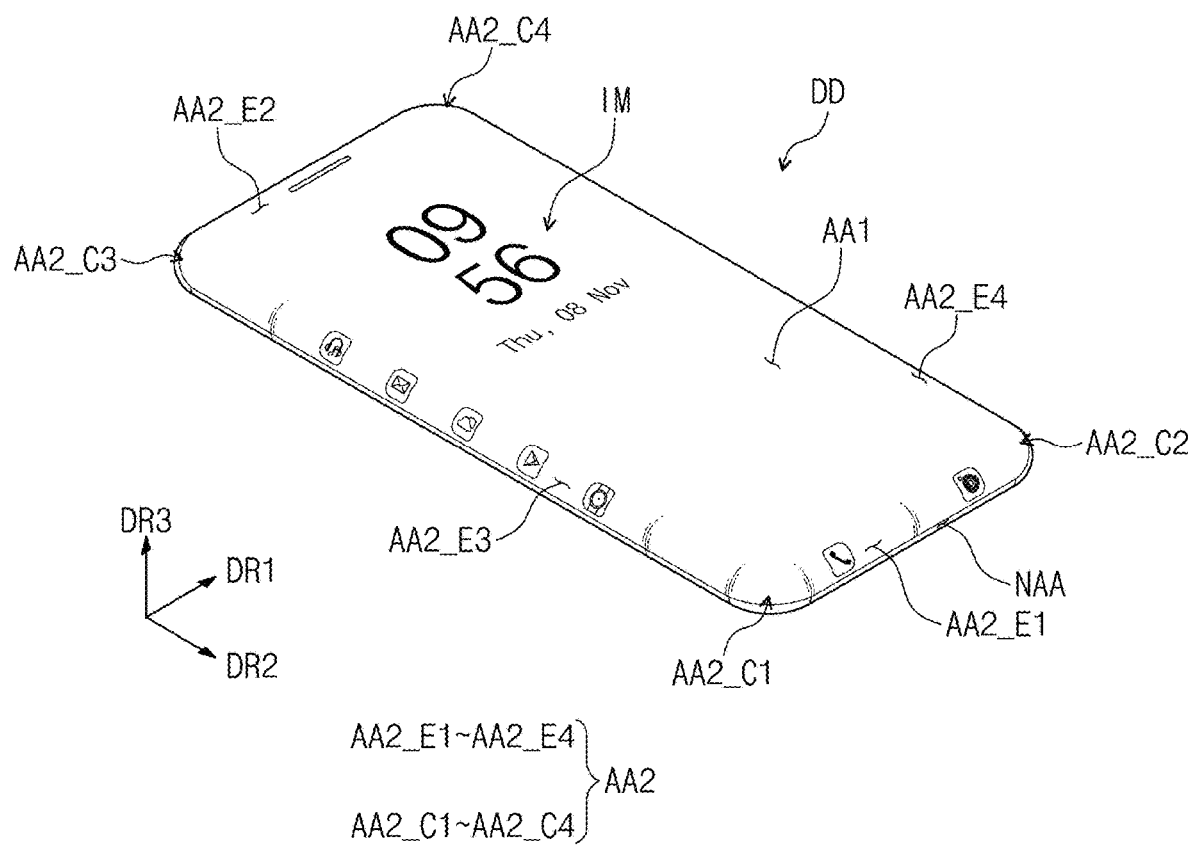
FIG. 1A is a perspective view of a display device according to an embodiment of the present invention.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." The term "and/or," includes all combinations of one or more of which associated components may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

In addition, terms such as "below," "lower," "above," "upper," and the like are used to describe the relationship of the components shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

Hereinafter, exemplary embodiments of the inventive concept will be described with reference to the accompanying drawings.

Figure 1B:
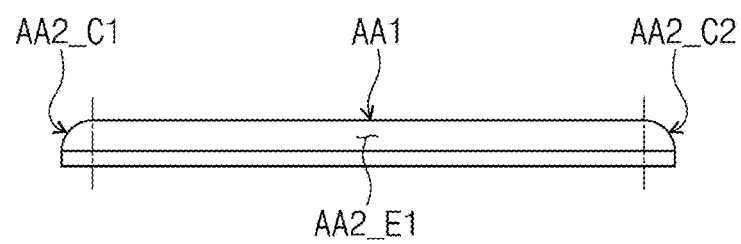
FIG. 1B is a side view showing the display device illustrated in FIG. 1A viewed in a second direction.
Figure 1B:
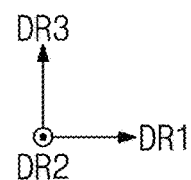
Figure 1C:
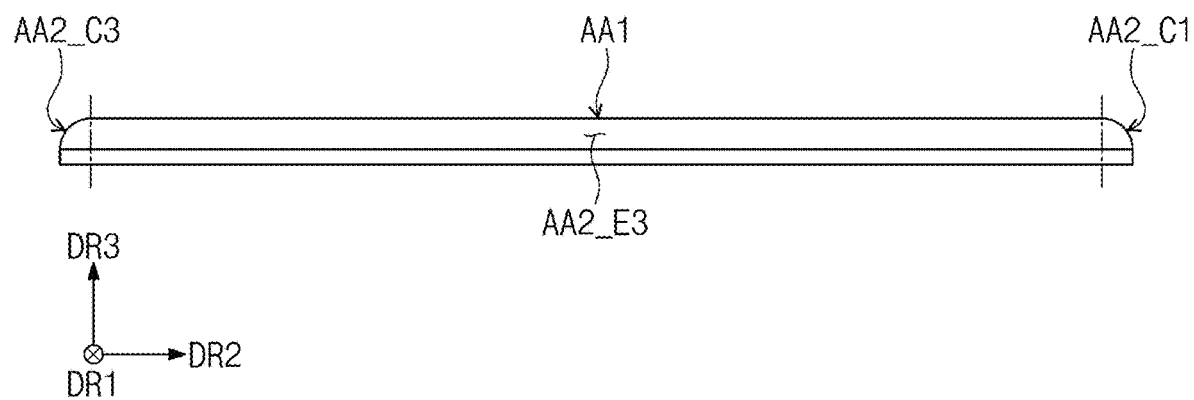
FIG. 1C is a side view of the display device illustrated in FIG. 1A viewed in a first direction.

FIG. 1A is a perspective view of a display device according to an embodiment of the present invention. FIG. 1B is a side view showing the display device illustrated in FIG. 1A viewed in a second direction. FIG. 1C is a side view of the display device illustrated in FIG. 1A viewed in a first direction.

In FIG. 1A to FIG. 1C, a display device DD is exemplarily illustrated as being a smart phone. However, the embodiment of the inventive concept is not limited thereto. The display device DD may be large electronic devices such as televisions, and monitors, or small- and medium-sized electronic devices such as mobile phones, tablet computers, car navigation system units, game consoles, and smart watches in another embodiment.

The display device DD includes active regions AA1 and AA2 in which an image IM is displayed and a peripheral region NAA in which the image IM is not displayed. In FIG. 1A, as an example of the image IM, date, time and icon images are illustrated.

The active regions AA1 and AA2 may include a first active region AA1 having a planar shape and a second active region AA2 extended from the first active region AA1. The second display region AA2 may be a region bent from the first active region AA1 to a predetermined curvature. However, the shape of the second active region AA2 is not limited thereto. In another embodiment, for example, the second active region AA2 may be extended from the first active region AA1 and have a planar shape inclined or perpendicular to the first active region AA1. The first and second active regions AA1 and AA2 may be regions which are only separate geometrically and may implement a single display surface together. The peripheral region NAA is a region in which the image IM is not displayed. A bezel region of the display device DD may be defined by the peripheral region NAA.

The first active region AA1 is parallel to a plane defined by a first direction DR1 and a second direction DR2. The first direction DR1 is a longitudinal direction of the display device DD, and the second direction DR2 is a latitudinal direction of the display device DD and cross the first direction DR1. The normal direction of the first active region AA1, that is, the thickness direction of the display device DD may be parallel to a third direction DR3. A front surface (in other words, an upper surface) and a back surface (in other words, a lower surface) of each member of the display device DD are defined according to the third direction DR3. However, directions indicated by the first to third directions DR1, DR2, and DR3 are a relative concept, and may be converted to different directions.

The second active region AA2 may include edge active regions AA2_E1 to AA2_E4 extended from side edges of the first active region AA1 and corner active regions AA2_C1 to AA2_C4 extended from corners of the first active region AA1. The second active region AA2 includes a first edge active region AA2_E1 extended from a first side of the first active region AA1, a second edge active region AA2_E2 extended from a second side of the first active region AA1, a third edge active region AA2_E3 extended from a third side of the first active region AA1, and a fourth edge active region AA2_E4 extended from a fourth side of the first active region AA1. The second active region AA2 further includes a first corner active region AA2_C1 extended from a first corner of the first active region AA1, a second corner active region AA2_C2 extended from a second corner of the first active region AA1, a third corner active region AA2_C3 extended from a third corner of the first active region AA1, and a fourth corner active region AA2_C4 extended from a fourth corner of the first active region AA1.

The first corner active region AA2_C1 is disposed between the first edge active region AA2_E1 and the third edge active region AA2_E3, and the second corner active region AA2_C2 is disposed between the first edge active region AA2_E1 and the fourth edge active region AA2_E4. The third corner active region AA2_C3 is disposed between the second edge active region AA2_E2 and the third edge active region AA2_E3, and the fourth corner active region AA2_C4 is disposed between the second edge active region AA2_E2 and the fourth edge active region AA2_E4.

The number of the edge active regions AA2_E1 to AA2_E4 and the number of the corner active regions AA2_C1 to AA2_C4 are not limited thereto. That is, depending on the shape of the first active region AA1, the number of the edge active regions AA2_E1 to AA2_E4 and the number of the corner active regions AA2_C1 to AA2_C4 included in the second active region AA2 may vary.

Each of the first to fourth edge active regions AA2_E1 to AA2_E4 may be bent to have a predetermined curvature in the third direction DR3. Each of the first to fourth edge active regions AA2_E1 to AA2_E4 may have a single curved surface shape. In addition, each of the first to fourth corner active regions AA2_C1 to AA2_C4 may be bent to have a predetermined curvature in the third direction DR3. Each of the first to fourth corner active regions AA2_C1 to AA2_C4 may have a double curved surface shape. For example, each of the first to fourth corner active regions AA2_C1 to AA2_C4 may have a first curve in the first direction DR1 and a second curve in the second direction DR2.

In an embodiment of the inventive concept, a first image displayed in the first active region AA1 and a second image displayed in the second active region AA2 may be dependent on each other. For example, a combination of the first image and the second image may form one picture, one scene of a movie, or a UI/UX design. Due to the second active region AA2 bent to have a predetermined curvature, the aesthetic feel of the display device DD may be improved, and the area of the peripheral region NAA recognized by a user in a plan view (i.e., view in the third direction DR3) may be reduced.

Figure 2A:
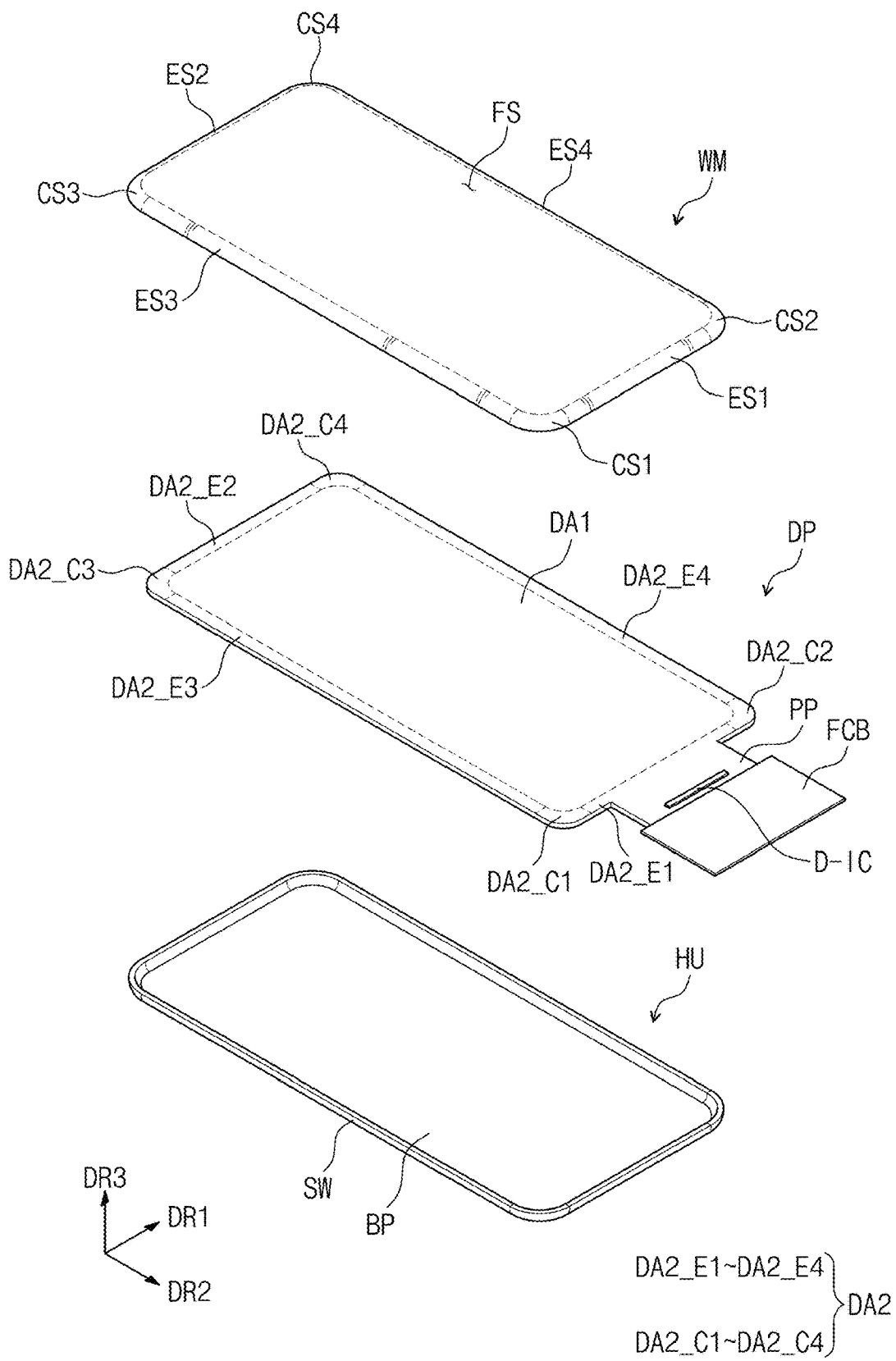
FIG. 2A is an exploded perspective view of a display device according to an embodiment of the inventive concept.
Figure 2B:
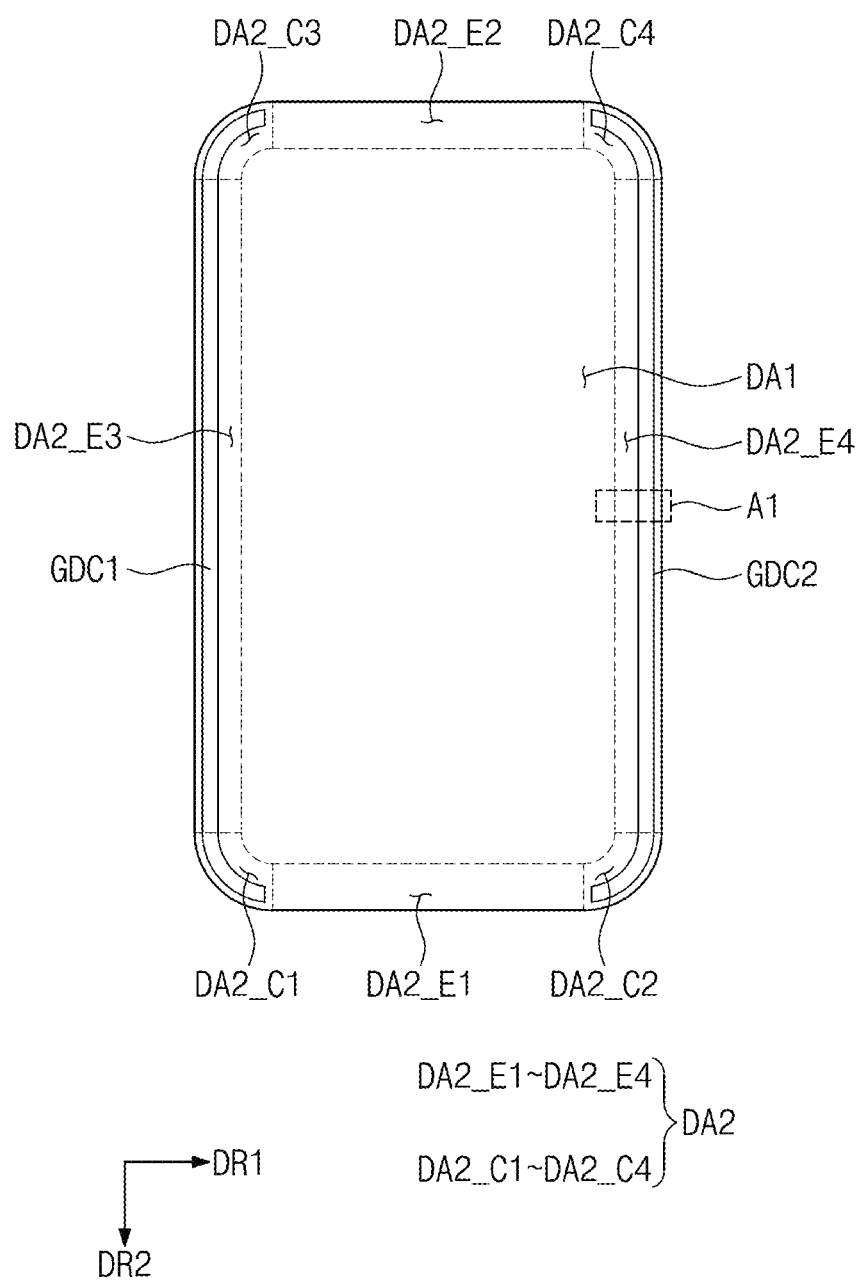
FIG. 2B and FIG. 2C are plan views showing an example of a display panel illustrated in FIG. 2A.
Figure 2C:
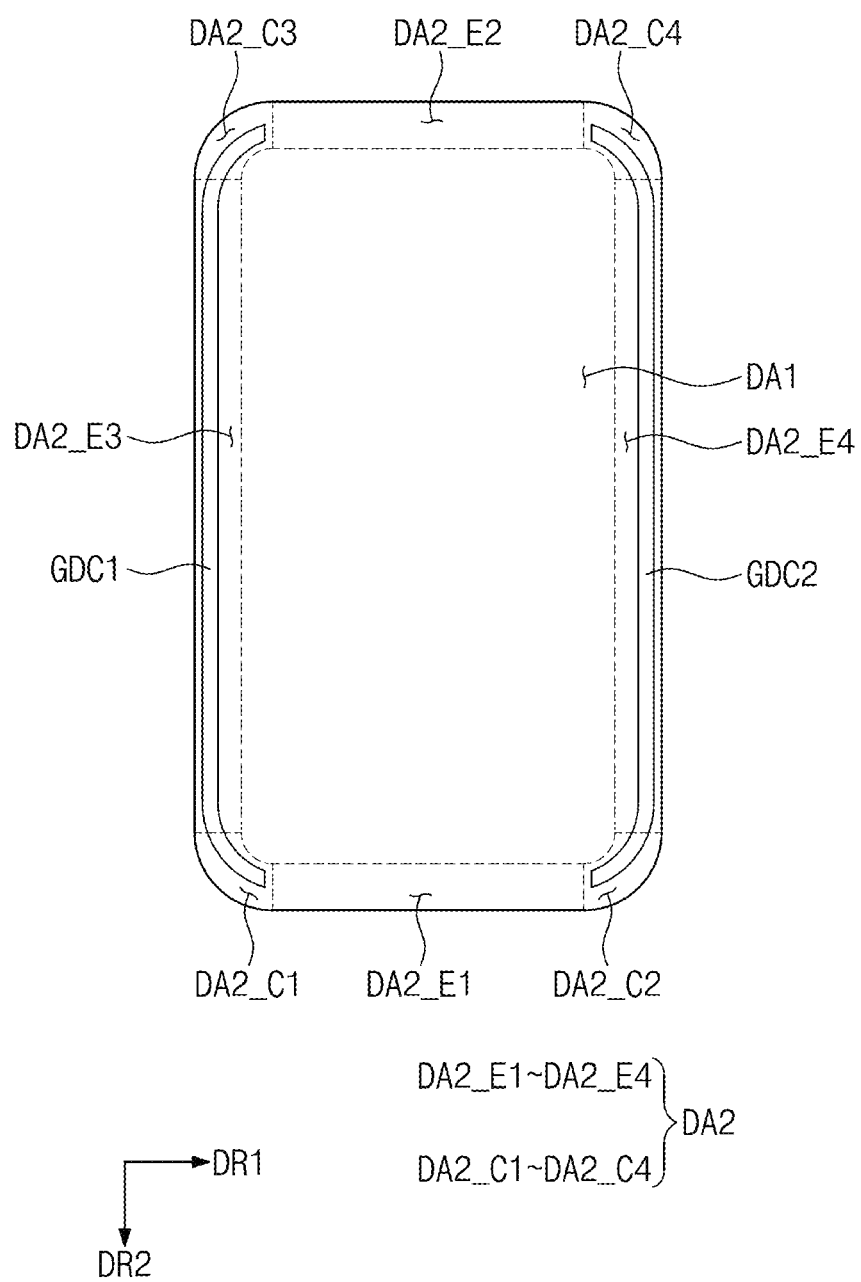

FIG. 2A is an exploded perspective view of a display device according to an embodiment of the inventive concept, and FIG. 2B and FIG. 2C are plan views showing an example of a display panel illustrated in FIG. 2A.

Referring to FIG. 2A, the display device DD may include a window WM, a display panel DP, and a housing HU. The window WM protects an upper surface of the display panel DP. The window WM may be optically transparent. Accordingly, an image displayed in the display panel DP may be transmitted through the window WM and be visible to a user. That is, a display surface of the display device DD may be defined by the window WM. The window WM may include or be composed of glass, plastic, or a film.

The window WM may have a curved surface structure. The window WM may include a front surface portion FS and one or more curved surface portions bent from the front surface portion FS. Here, the front surface portion FS and the one or more curved surface portions may be defined as a transmission unit which transmits an image or light. The front surface portion FS of the window WM may define the first active region AA1 (see FIG. 1A) of the display device DD, and the one or more curved surface portions may define the second active region AA2 (see FIG. 1A) of the display device DD.

As an example of the inventive concept, the window WM may include four curved surface portions, that is, a first curved surface portion ES1, a second curved surface portion ES2, a third curved surface portion ES3, and a fourth curved surface portion ES4. In the present embodiment, the front surface portion FS may be a plane defined by the first direction DR1 and the second direction DR2. The front surface portion FS may be perpendicular to the third direction DR3. Each of the first to fourth curved surface portions ES1 to ES4 is bent from the front surface portion FS.

Each of the first curved surface portion ES1 and the second curved surface portion ES2 is bent from the front surface portion FS. The first and second curved surface portions ES1 and ES2 may be bent from a first side and a second side of the front surface portion FS, respectively. The first and second sides of the front surface portion FS may be parallel to the first direction DR1. The first curved surface portion ES1 and the second curved surface portion ES2 may be disposed to be parallel to each other in the first direction DR1.

Each of the third curved surface portion ES3 and the fourth curved surface portion ES4 is bent from the front surface portion FS. Particularly, the third and fourth curved surface portions ES3 and ES4 may be bent from a third side and a fourth side of the front surface portion FS, respectively. The third and fourth sides of the front surface portion FS may be parallel to the second direction DR2. The third curved surface portion ES3 and the fourth curved surface portion ES4 may be disposed to be parallel to each other in the second direction DR2.

Each of the first to fourth curved surface portions ES1 to ES4 may be bent from the front surface portion FS to a predetermined curvature. As an example of the inventive concept, the first to fourth curved surface portions ES1 to ES4 may have the same curvature. As another example of the inventive concept, while the first and second curved surface portions ES1 and ES2 have the same curvature, and the third and fourth curved surface portions ES3 and ES4 have the same curvature, the first and second curved surface portions ES1 and ES2 may have a different curvature from that of the third and fourth curved surface portions ES3 and ES4.

The window WM may further include at least one corner portion. As an example of the inventive concept, the window WM may include four corner portions, that is, a first corner portion CS1, a second corner portion CS2, a third corner portion CS3, and a fourth corner portion CS4. Each of the first to fourth corner portions CS1 to CS4 may have at least two curvatures. Each of the first to fourth corner portions CS1 to CS4 may have a shape in which curved surfaces having different curvatures in different directions are connected in succession.

The first corner portion CS1 is disposed between the first curved surface portion ES1 and the third curved surface portion ES3, and connects the first and third curved surface portions ES1 and ES3. The second corner portion CS2 is disposed between the first curved surface portion ES1 and the fourth curved surface portion ES4, and connects the first and fourth curved surface portions ES1 and ES4. The third corner portion CS3 is disposed between the second curved surface portion ES2 and the third curved surface portion ES3, and connects the second and third curved surface portions ES2 and ES3. The fourth corner portion CS4 is disposed between the second curved surface portion ES2 and the fourth curved surface portion ES4, and connects the second and fourth curved surface portions ES2 and ES4. Here, each of the first to fourth corner portions CS1 to CS4 may be defined as a transmission unit which transmits an image or light.

Referring to FIG. 2A and FIG. 2B, the display panel DP may include a display region which displays an image. As an example of the inventive concept, the display region may include a first display region DA1 and a second display region DA2. The first display region DA1 is disposed to be parallel to the front surface portion FS of the window WM, and may have a shape corresponding to the front surface portion FS. That is, the first display region DA1 may be a flat surface display region having a planar shape. The second display region DA2 is disposed corresponding to one or more curved surface portions and one or more corner portions. The second display region DA2 may have a curved surface shape corresponding to one or more curved surface portions and one or more corner portions.

The second display region DA2 includes first to fourth edge display regions DA2_E1 to DA2_E4 disposed corresponding to the first to fourth curved surface portions ES1 to ES4, respectively. The first and second edge display regions DA2_E1 and DA2_E2 are bent from a first side and a second side of the first display region DA1, and may be disposed corresponding to the first and second curved surface portions ES1 and ES2 of the window WM, respectively. The first and second sides of the first display region DA1 are extended parallel to the first direction DR1. The first and second edge display regions DA2_E1 and DA2_E2 may be bent from the first display region DA1 to a predetermined curvature.

The third and fourth edge display regions DA2_E3 and DA2_E4 are bent from a third side and a fourth side of the first display region DA1, and may be disposed corresponding to the third and fourth curved surface portions ES3 and ES4 of the window WM, respectively. The third and fourth sides of the first display region DA1 are extended parallel to the second direction DR2. Each of the third and fourth edge display regions DA2_E3 and DA2_E4 may be bent from the first display region DA1 to a predetermined curvature.

In the above, a structure in which the second display region DA2 includes four edge display regions DA2_E1 to DA2_E4 in the display panel DP according to an embodiment of the inventive concept has been described. However, the structure of the display panel DP according to the inventive concept is not limited thereto. That is, the second display region DA2 of the display panel DP may include only one edge display region, or may include two edge display regions provided on the first and second sides or on the third and fourth sides of the first display region DA1 in another embodiment.

The second display region DA2 may further include first to fourth corner display regions DA2_C1 to DA2_C4 disposed corresponding to the first to fourth corner portions CS1 to CS4 of the window WM, respectively. The first corner display region DA2_C1 is disposed between the first and third edge display regions DA2_E1 and DA2_E3, and the second corner display region DA2_C2 is disposed between the first and fourth edge display regions DA2_E1 and DA2_E4. In addition, the third corner display region DA2_C3 is disposed between the second and third edge display regions DA2_E2 and DA2_E3, and the fourth corner display region DA2_C4 is disposed between the second and fourth edge display regions DA2_E2 and DA2_E4. The first to fourth corner display regions DA2_C1 to DA2_C4 may be regions in which an image is substantially displayed. However, the embodiment of the inventive concept is not limited thereto. That is, as another example, the first to fourth corner display regions DA2_C1 to DA2_C4 may be regions which do not display an image, and only some thereof may display an image.

The display panel DP may include pixels disposed in the first display region DA1 and pixels disposed in the second display region DA2. Here, the pixels disposed in the first display region DA1 are referred to as main pixels, and the pixels disposed in the second display region DA2 may be referred to as sub-pixels. Each of the pixels may include a light emitting element and a pixel driving circuit connected to the light emitting element.

The display panel DP may further include driving drivers GDC1 and GDC2. The driving drivers GDC1 and GDC2 may include a first driving driver GDC1 and a second driving driver GDC2. Each of the driving drivers GDC1 and GDC2 generates a plurality of scan signals and a plurality of light emission control signals, and may output the generated signals to corresponding pixels.

The display panel DP may further include a non-display region around the second display region DA2. The non-display region is a region in which an image is not substantially displayed. The non-display region may surround the second display region DA2.

Each of the driving drivers GDC1 and GDC2 may be disposed in the second display region DA2, or may be disposed to partially overlap the second display region DA2. When each of the driving drivers GDC1 and GDC2 is disposed in the second display region DA2, it is possible to prevent the width of the non-display region from being increased by the first and second driving drivers GDC1 and GDC2. As a result, the area of the non-display region to be recognized by a user in the display device DD may be reduced by the second display region DA2.

As illustrated in FIG. 2B, the first driving driver GDC1 is disposed to be adjacent to an outer side edge of the third edge display region DA2_E3, and the second driving driver GDC2 is disposed to be adjacent to an outer side edge of the fourth edge display region DA2_E4. In addition, the first driving driver GDC1 is further disposed to be adjacent to outer side edges of the first and third corner display regions DA2_C1 and DA2_C3, and the second driving driver GDC2 is further disposed to be adjacent to outer side edges of the second and fourth corner display regions DA2_C2 and DA2_C4. However, the positions of the first and second driving drivers GDC1 and GDC2 according to the invention are not limited thereto.

As illustrated in FIG. 2C, the first driving driver GDC1 is disposed adjacent to a boundary with the first display region DA1 in the first and third corner display regions DA2_C1 and DA2_C3, and the second driving driver GDC2 is disposed adjacent to a boundary with the first display region DA1 in the second and fourth corner display regions DA2_C2 and DA2_C4. The bending stress of the first to fourth corner display regions DA2_C1 to DA2_C4 may increase toward the outside based on the first display regions DA1. When the first and second driving drivers GDC1 and GDC2 are disposed to be adjacent to an outer side edge in the first to fourth corner display regions DA2_C1 to DA2_C4, the bending stress may affect the operation of the first and second driving drivers GDC1 and GDC2. Therefore, by disposing the first and second driving drivers GDC1 and GDC2 adjacent to the first display region DA1 in the first to fourth corner display regions DA2_C1 to DA2_C4, it is possible to prevent the deterioration in reliability of the first and second driving drivers GDC1 and GDC2 caused by the bending stress.

In an embodiment of the inventive concept, a first image displayed in the first display region DA1 and a second image displayed in the second display region DA2 may be dependent on each other. For example, a combination of the first image and the second image may form one picture, one scene of a movie, or a UI/UX design. However, the embodiment of the inventive concept is not limited thereto. In another embodiment, for example, some display regions of the second display region DA2, for example, the first to fourth corner display regions DA2_C1 to DA2_C4, may display a black image not dependent on the first image or a predetermined pattern image.

As an example of the inventive concept, the display panel DP may be an organic light emitting display panel, an electrophoretic display panel, or an electrowetting display panel. In addition, the display panel DP may be a flexible display panel which may be bent according to the shape of the window WM.

Referring back to FIG. 2A, the display panel DP may further include a pad region PP extended from the second display region DA2. In the pad region PP of the display panel DP, a driving chip D-IC and pads may be disposed. The driving chip D-IC may provide a driving signal to the first and second display regions DA1 and DA2 of the display panel DP. The driving chip D-IC may be mounted on the display panel DP. The display panel DP may be electrically connected to a printed circuit board PCB through the pads. In an embodiment of the inventive concept, the driving chip D-IC may be mounted on the printed circuit board PCB.

The housing HU includes a bottom portion BP and a sidewall SW. The sidewall SW may be extended from the bottom portion BP. The housing HU may accommodate the display panel DP in an accommodation space defined by the bottom portion BP and the sidewall SW. The window WM may be coupled to the sidewall SW of the housing HU. The sidewall SW of the housing HY may support an edge of the window WM.

The housing HU may include a material having relatively high rigidity. For example, the housing HU may include glass, plastic, or a metal, or may include a plurality of frames and/or plates composed of a combination thereof. The housing HU may stably protect components of the display device DD accommodated in an internal space from an external impact.

Figure 3A:
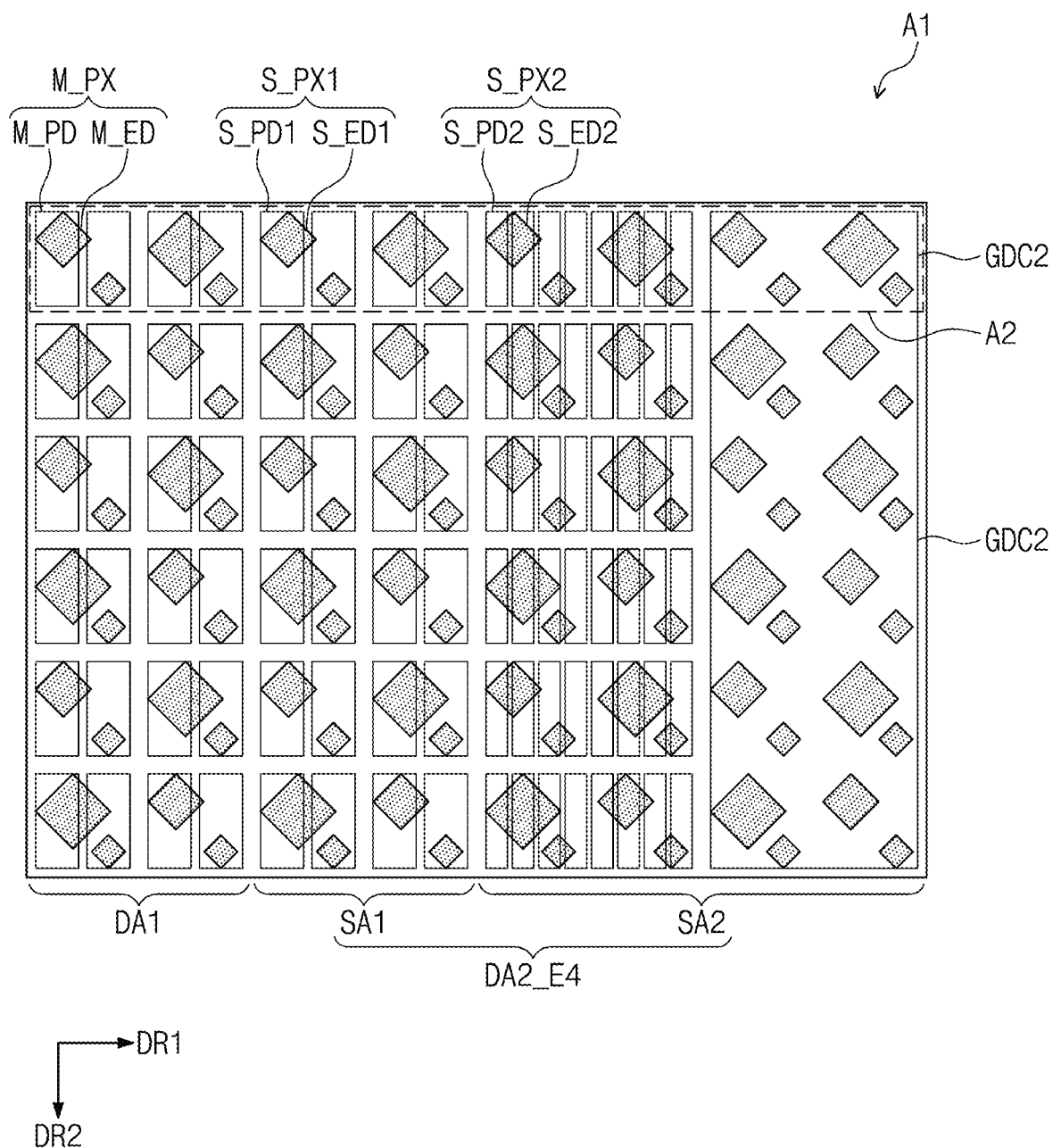
FIG. 3A is an enlarged plan view of region A1 illustrated in FIG. 2B according to an embodiment of the inventive concept.
Figure 3B:
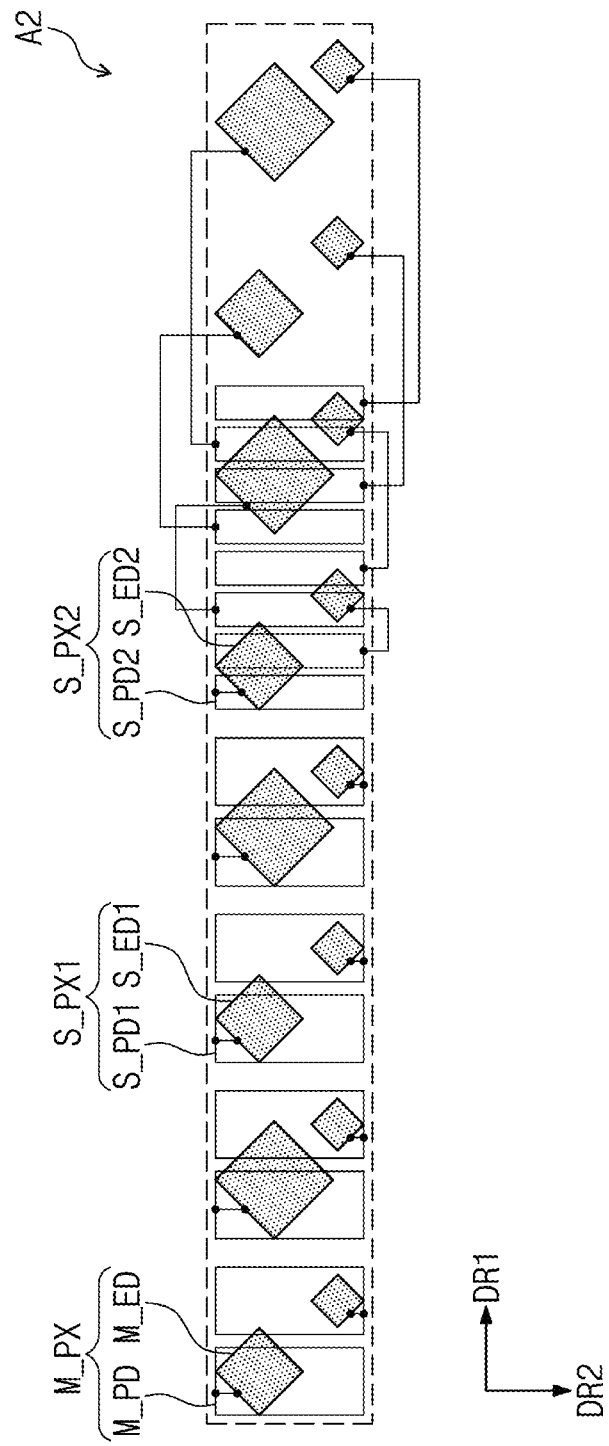
FIG. 3B is a view showing the connection relationship between light emitting elements and pixel driving circuits in region A2 illustrated in FIG. 3A.
Figure 3C:
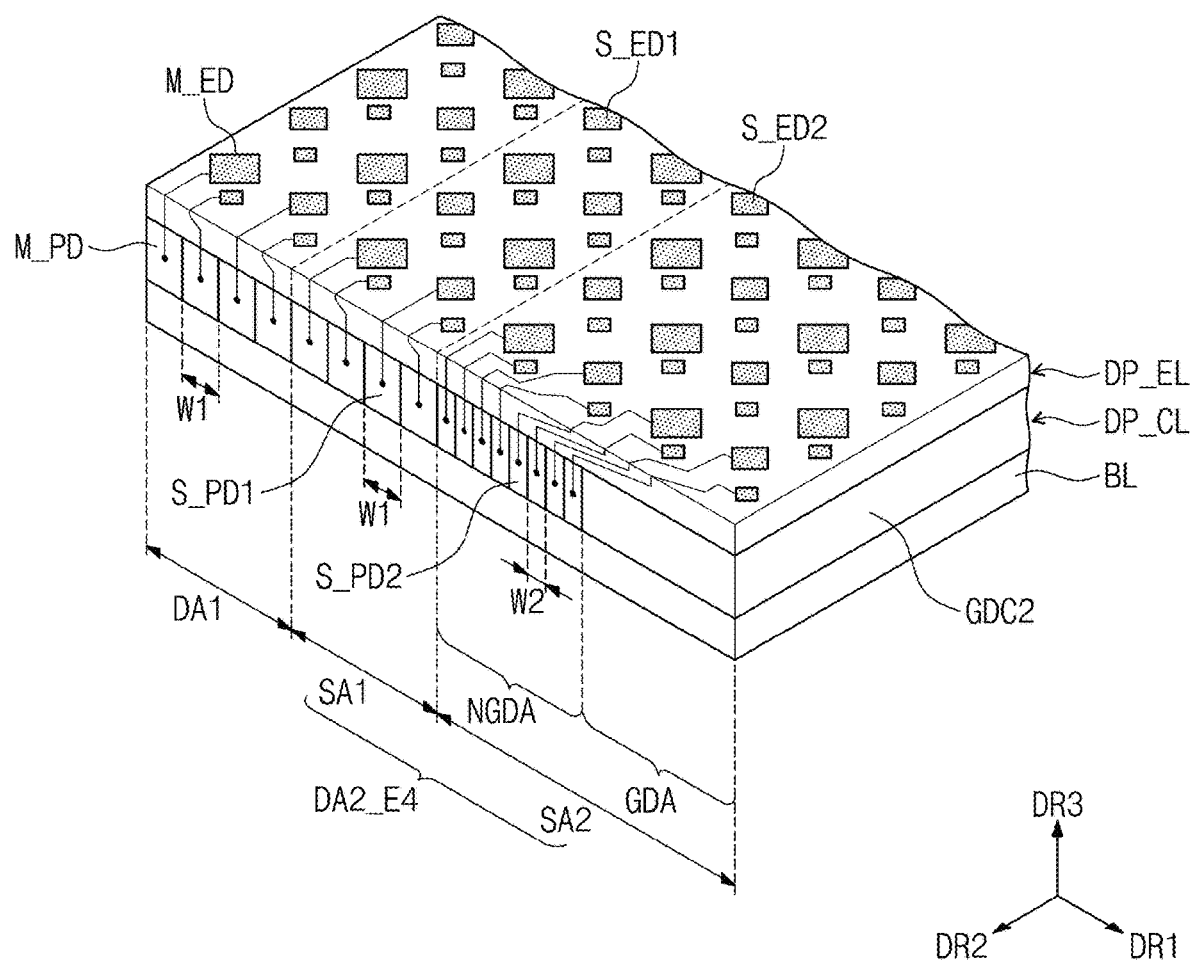
FIG. 3C is an enlarged perspective view of region A1 illustrated in FIG. 2B according to an embodiment of the inventive concept.

FIG. 3A is an enlarged plan view of region A1 illustrated in FIG. 2B according to an embodiment of the inventive concept, and FIG. 3B is a view showing the connection relationship between light emitting elements and pixel driving circuits in region A2 illustrated in FIG. 3A. FIG. 3C is an enlarged perspective view of region A1 illustrated in FIG. 2B according to an embodiment of the inventive concept.

Referring to FIG. 3A to FIG. 3C, in the first display region DA1 of the display panel DP, main pixels M_PX are disposed. The main pixels M_PX may include a plurality of red pixels, a plurality of green pixels, and a plurality of blue pixels. Each of the main pixels M_PX includes a pixel driving circuit and a light emitting element. Here, the pixel driving circuit of each main pixel M_PX is referred to as a main pixel driving circuit M_PD, and the light emitting element of each main pixel M_PX is referred to as a main light emitting element M_ED.

The fourth edge display region DA2_E4 of the second display region DA2 (refer to FIG. 2B) may include first and second sub-regions SA1 and SA2. FIG. 3A and FIG. 3B illustrate only the fourth edge display region DA2_E4 of the second display region DA2. However, the first to third edge display regions DA2_E1 to DA2_E3 of the second display region DA2 and the first to fourth corner display regions DA2_C1 to DA2_C4 have a structure similar to that of the fourth edge display region DA2_E4 in the pixel level. Therefore, the fourth edge display region DA2_E4 will be described with reference to FIG. 3A and FIG. 3B, and description of the rest of the regions of the second display region DA2 will be omitted.

In the first sub-region SA1 of the display panel DP, first sub-pixels S_PX1 are disposed, and in the second sub-region SA2 of the display panel DP, second sub-pixels S_PX2 are disposed. The first sub-pixels S_PX1 may include a plurality of red pixels, a plurality of green pixels, and a plurality of blue pixels. Each of the first sub-pixels S_PX1 includes a pixel driving circuit and a light emitting element. Here, the pixel driving circuit of each first sub-pixel S_PX1 is referred to as a first sub-pixel driving circuit S_PD1, and the light emitting element of each first sub-pixel S_PX1 is referred to as a first sub-light emitting element S_ED1. The second sub-pixels S_PX2 may include a plurality of red pixels, a plurality of green pixels, and a plurality of blue pixels. Each of the second sub-pixels S_PX2 includes a pixel driving circuit and a light emitting element. Here, the pixel driving circuit of each second sub-pixel S_PX2 is referred to as a second sub-pixel driving circuit S_PD2, and the light emitting element of each second sub-pixel S_PX2 is referred to as a second sub-light emitting element S_ED2.

The first sub-pixels S_PX1 disposed in the first sub-region SA1 of the fourth edge display region DA2_E4 may have the same pixel structure as that of the main pixels M_PX disposed in the first display region DA1. Particularly, the first sub-pixel driving circuit S_PD1 and the main pixel driving circuit M_PD may have the same circuit structure. For example, the number of transistors included in the first sub-pixel driving circuit S_PD1 and the number of transistors included in the main pixel driving circuit M_PD may be the same. In addition, when the first sub-light emitting element S_ED1 and the main light emitting element M_ED emitting the same color are compared, the first sub-light emitting element S_ED1 and the main light emitting element M_ED may have the same size and the same shape. Here, each of the first sub-light emitting element S_ED1 and the main light emitting element M_ED may include an organic light emitting diode.

The second sub-pixels S_PX2 disposed in the second sub-region SA2 of the fourth edge display region DA2_E4 may have a different pixel structure from that of the main pixels M_PX disposed in the first display region DA1. Particularly, the second sub-pixel driving circuit S_PD2 and the main pixel driving circuit M_PD may have different circuit structures from each other. For example, the number of transistors included in the second sub-pixel driving circuit S_PD2 and the number of transistors included in the main pixel driving circuit M_PD may be different from each other. The number of transistors included in the second sub-pixel driving circuit S_PD2 may be smaller than the number of transistors included in the main pixel driving circuit M_PD. The size and area of the second sub-pixel driving circuit S_PD2 may be smaller than the size and area of the main pixel driving circuit M_PD, respectively. The second sub-pixel driving circuits S_PD2 of the second sub-pixels S_PX2 disposed in the second sub-region SA2 may not overlap the second driving driver GDC2 in a plan view.

When the second sub-light emitting element S_ED2 and the main light emitting element M_ED emitting the same color are compared, the first sub-light emitting element S_ED1 and the main light emitting element M_ED may have the same size and the same shape. Some of the second sub-light emitting elements S_ED2 of the second sub-pixels S_PX2 may not overlap the second driving driver GDC2 in a plan view, and some of the second sub-light emitting elements S_ED2 may overlap the second driving driver GDC2 in a plan view. That is, some of the second sub-light emitting elements S_ED2 of the second sub-pixels S_PX2 may be disposed on the second sub-pixel driving circuits S_PD2, and some of the second sub-light emitting elements S_ED2 may be disposed on the second driving driver GDC2.

As illustrated in FIG. 3C, the display panel DP includes a base layer BL, a circuit element layer DP_CL disposed on the base layer BL, and a display element layer DP_EL disposed on the circuit element layer DP_CL. The circuit element layer DP_CL may be defined as a layer in which the main pixel driving circuits M_PD, the first and second sub-pixel driving circuits S_PD1 and S_PD2, and the second driving driver GDC2 are disposed. That is, the second driving driver GDC2 is disposed in the same layer as the main pixel driving circuits M_PD and the first and second sub-pixel driving circuits S_PD1 and S_PD2.

Each of the main pixel driving circuits M_PD has a first width W1 in the first direction DR1, each of the first sub-pixel driving circuits S_PD1 has the first width W1 in the first direction DR1, and each of the second sub-pixel driving circuits S_PD2 has a second width W2 in the first direction DR1. Here, the second width W2 may be smaller than the first width W1.

The display element layer DP_EL includes the main pixel light emitting elements M_ED and the first and second sub-light emitting elements S_ED1 and S_ED2. The display element layer DP_EL may overlap the second driving driver GDC2. Some of the sub-light emitting elements S_ED2 disposed in the display element layer DP_EL may overlap the second driving driver GDC2. Therefore, an image may be displayed by the second sub-light emitting elements S_ED2 even in a region (hereinafter, a driving region GDA) in which the second driving driver GDC2 is disposed in the second sub-region SA2 in a plan view.

The second sub-pixel driving circuits S_PD2 configured to drive the second sub-light emitting elements S_ED2 of the second sub-region SA2 are disposed in a region (hereinafter, a non-driving region NGDA) in which the second driving driver GDC2 is not disposed. In order to intensively dispose the second sub-pixel driving circuits S_PD2 in the non-driving region NGDA having a limited size, each of the second sub-pixel driving circuits S_PD2 may have a width, size, or area smaller than those of each first sub-light emitting element S_ED1. To this end, the number of transistors included in each of the second sub-pixel driving circuits S_PD2 may be smaller than the number of transistors included in each of the first sub-pixel driving circuits S_PD1.

Figure 4A:
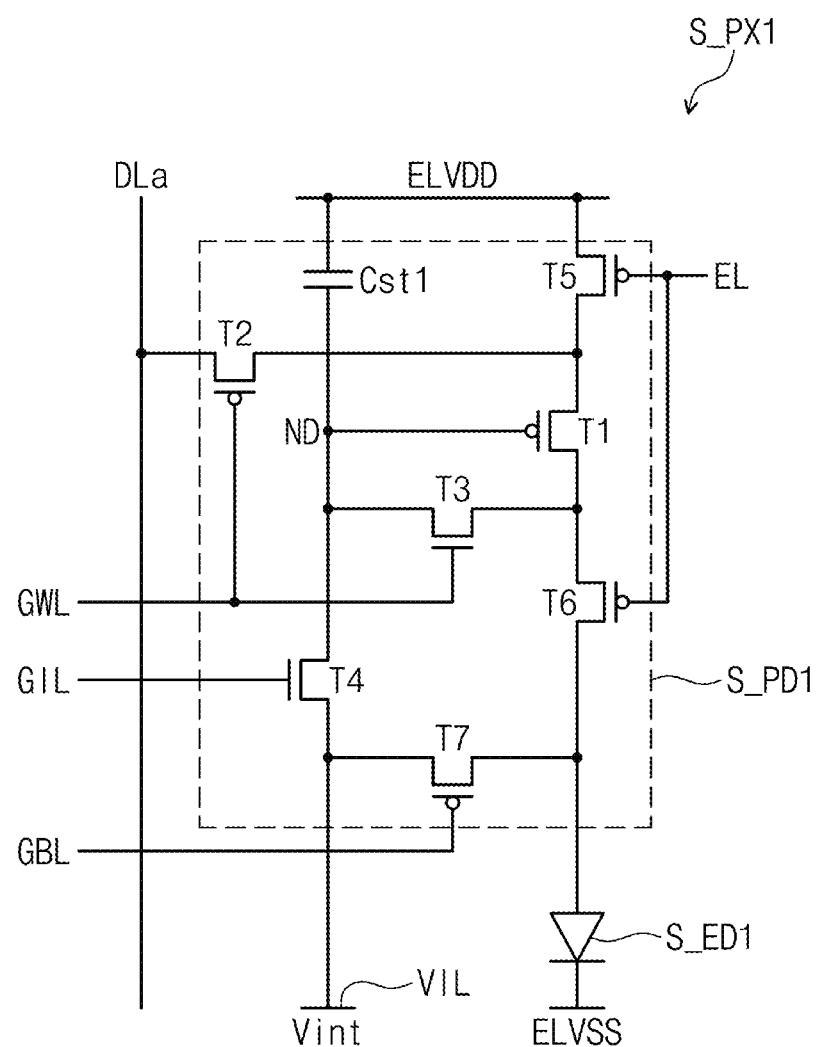
FIG. 4A is an equivalent circuit diagram of a first sub-pixel according to an embodiment of the inventive concept.
Figure 4B:
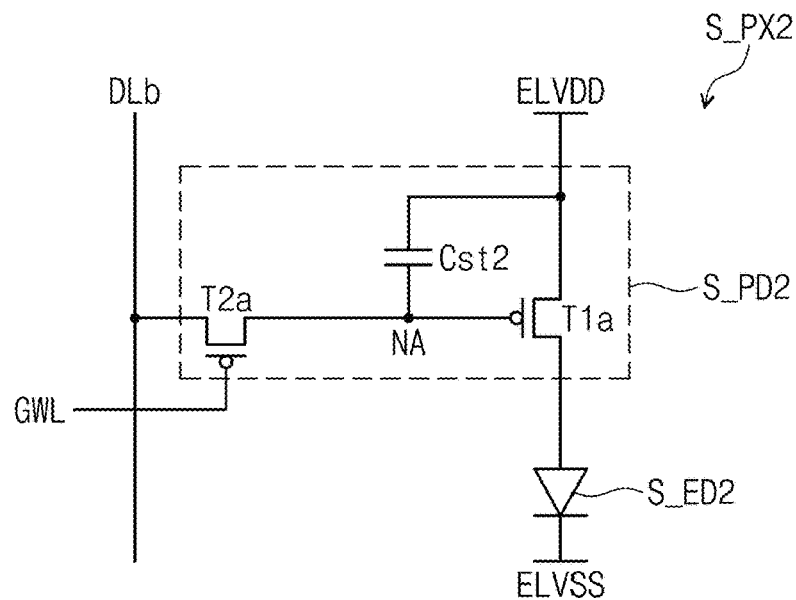
FIG. 4B is an equivalent circuit diagram of a second sub-pixel according to an embodiment of the inventive concept.
Figure 4C:
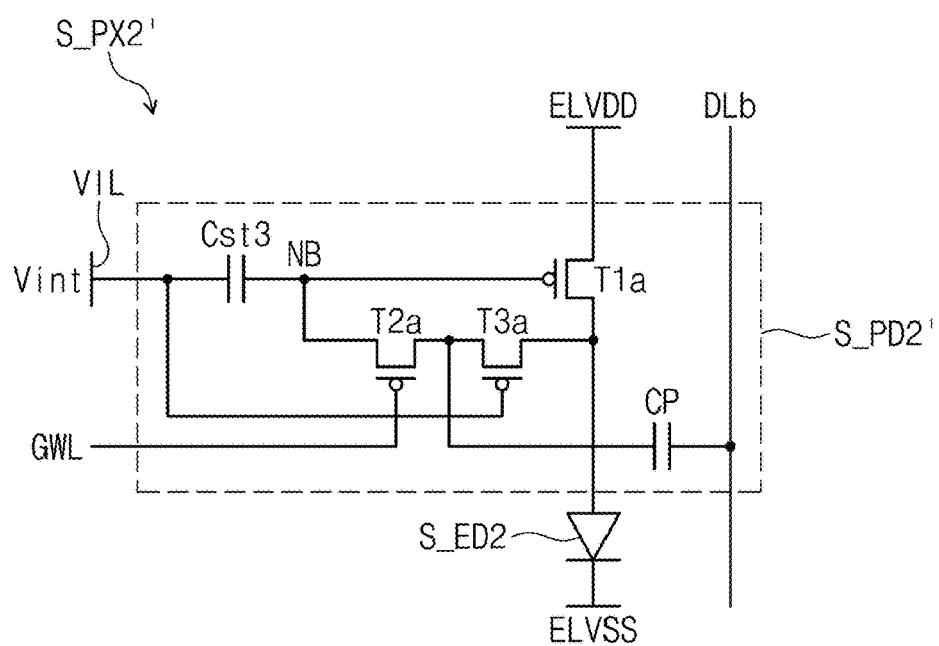
FIG. 4C is an equivalent circuit diagram of a second sub-pixel according to another embodiment of the inventive concept.
Figure 4D:
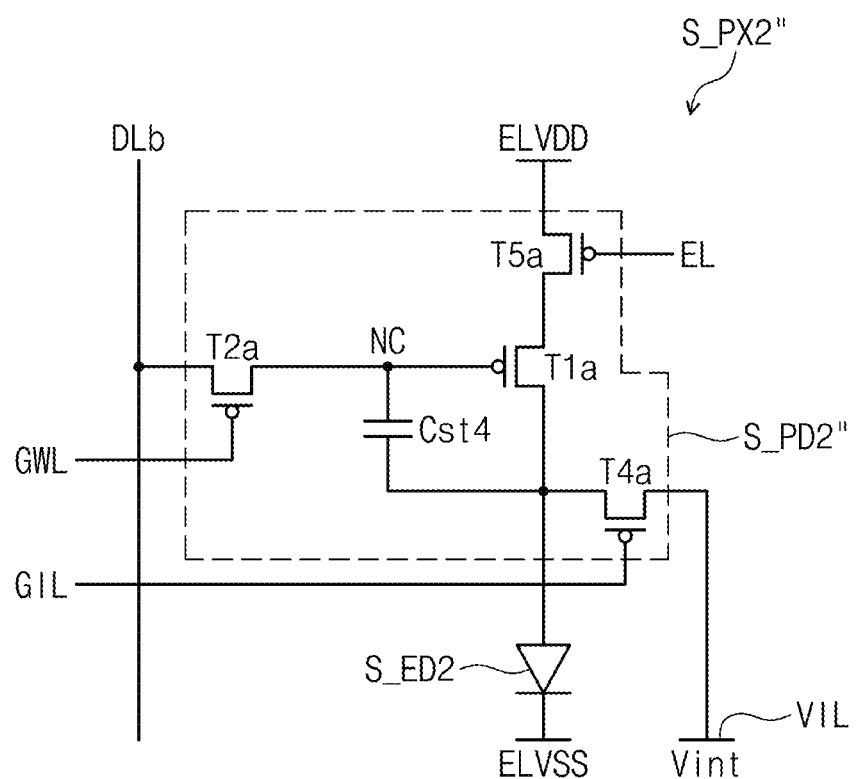
FIG. 4D is an equivalent circuit diagram of a first sub-pixel according to still another embodiment of the inventive concept.
Figure 5A:
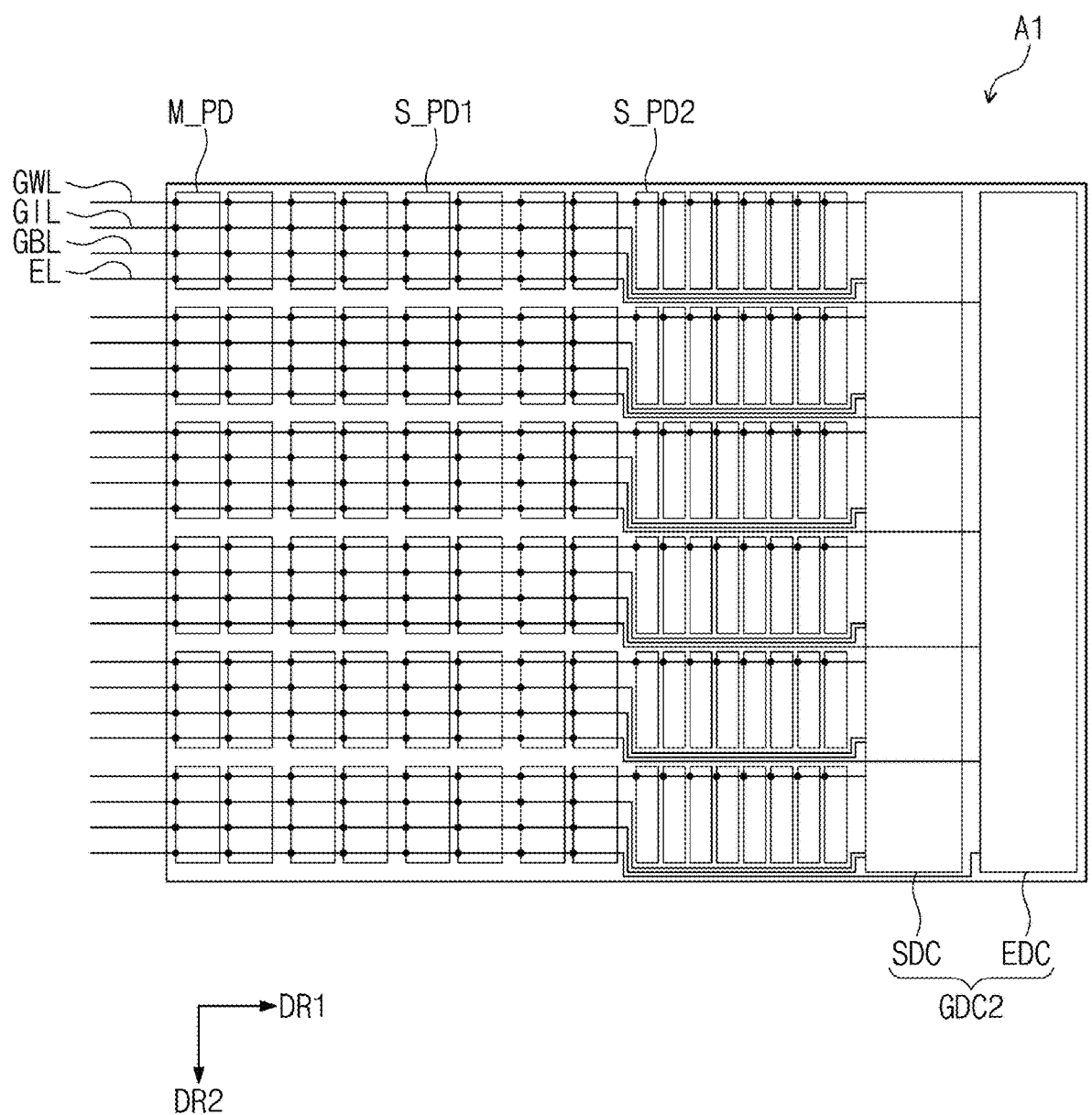
FIG. 5A is a plan view showing the connection relationship between second sub-pixels and signal lines having the circuit structure illustrated in FIG. 4B.
Figure 5B:
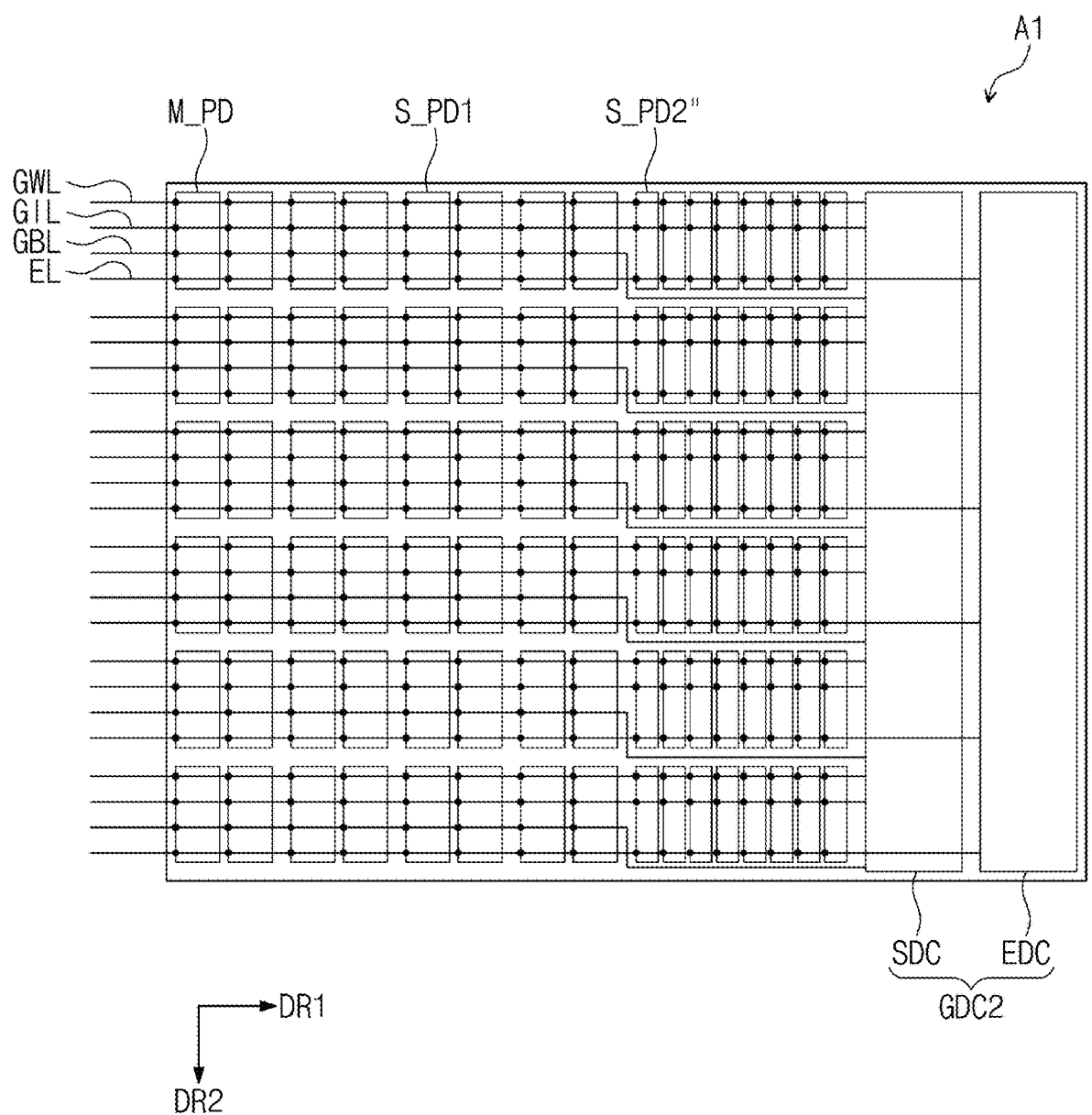
FIG. 5B is a plan view showing the connection relationship between second sub-pixels and signal lines having the circuit structure illustrated in FIG. 4D.

FIG. 4A is an equivalent circuit diagram of a first sub-pixel according to an embodiment of the inventive concept, and FIG. 4B is an equivalent circuit diagram of a second sub-pixel according to an embodiment of the inventive concept. FIG. 4C is an equivalent circuit diagram of a second sub-pixel according to another embodiment of the inventive concept, and FIG. 4D is an equivalent circuit diagram of a second sub-pixel according to still another embodiment of the inventive concept. FIG. 5A is a plan view showing the connection relationship between second sub-pixels and signal lines having the circuit structure illustrated in FIG. 4B, and FIG. 5B is a plan view showing the connection relationship between second sub-pixels and signal lines having the circuit structure illustrated in FIG. 4D.

Referring to FIG. 4A, the first sub-pixel S_PX1 according to an embodiment of the inventive concept may include the first sub-pixel driving circuit S_PD1 and the first sub-light emitting element S_ED1. The first sub-pixel driving circuit S_PD1 includes a plurality of transistors T1 to T7 and a capacitor Cst1. The plurality of transistors T1 to T7 and the capacitor Cst1 may control the amount of current flowing in the first sub-light emitting element S_ED1 in response to a data signal and scan signals.

Each of the plurality of transistors T1 to T7 may include an input electrode (in other words, a source electrode), an output electrode (in other words, a drain electrode), and a control electrode (in other words, a gate electrode). In the present disclosure, any one of the input electrode and the output electrode may be referred to as a first electrode, and the other one thereof may be referred to as a second electrode for convenience.

A first electrode of a first transistor T1 may receive a driving power voltage ELVDD via a fifth transistor T5. A second electrode of the first transistor T1 is connected to an anode electrode of the first sub-light emitting element S_ED1 via a sixth transistor T6. The first transistor T1 may control the amount of current flowing in the first sub-light emitting element S_ED1 in correspondence to a voltage applied to a control electrode of the first transistor T1.

A second transistor T2 is connected between a data line DLa and the first electrode of the first transistor T1. A control electrode of the second transistor T2 is connected to a first scan line GWL. When a first scan signal is provided to the first scan line GWL, the second transistor T2 is turned on to electrically connect the data line DLa and the first electrode of the first transistor T1.

A third transistor T3 is connected between the second electrode of the first transistor T1 and the control electrode of the first transistor T1. A control electrode of the third transistor T3 is connected to the first scan line GWL. When the first scan signal is provided to the first scan line GWL, the third transistor T3 is turned on to electrically connect the second electrode of the first transistor T1 and the control electrode of the first transistor T1. Accordingly, when the third transistor T3 is turned on, the first transistor T1 functions as a diode.

A fourth transistor T4 is connected between a node ND and an initialization voltage line VIL. In addition, a control electrode of the fourth transistor T4 is connected to a second scan line GIL. The node ND may be a node to which the fourth transistor T4 and the control electrode of the first transistor T1 are connected. When a second scan signal is provided to the second scan line GIL, the fourth transistor T4 is turned on to provide an initialization voltage Vint to the node ND. Here, the second scan signal may be a signal generated prior to the first scan signal. For example, the second scan signal may be the same signal as a signal applied to the first scan line GWL of a pixel in a previous row.

The fifth transistor T5 is connected between a driving power line and the first electrode of the first transistor T1. The sixth transistor T6 is connected between the second electrode of the first transistor T1 and the anode electrode of the first sub-light emitting element S_ED1. A control electrode of the fifth transistor T5 and a control electrode of the sixth transistor T6 are connected to a light emission control line EL.

A seventh transistor T7 is connected between the initialization voltage line VIL and the anode electrode of the first light emitting element S_ED1. A control electrode of the seventh transistor T7 is connected to a third scan line GBL. When a third scan signal is provided to the third scan line GBL, the seventh transistor T7 is turned on to provide the initialization voltage Vint to the anode electrode of the first light emitting element S_ED1. For example, the third scan signal may be the same signal as a signal applied to the first scan line GWL of a pixel in a next row.

Additionally, FIG. 4A illustrates the control electrode of the seventh transistor T7 being connected to the third scan line GBL, but the embodiment of the inventive concept is not limited thereto. In another embodiment of the inventive concept, the control electrode of the seventh transistor T7 may be connected to the second scan line GIL.

In FIG. 4A, the first to seventh transistors T1 to T7 are illustrated as being a PMOS transistor, but the embodiment of the inventive concept is not limited thereto. In another embodiment of the inventive concept, some or all of the first to seventh transistors T1 to T7 may be each configured to be an NMOS transistor.

The capacitor Cst1 is disposed between the driving power line and the node ND. The capacitor Cst1 stores a voltage corresponding to a data signal. When the fifth transistor T5 and the sixth transistor T6 are turned on, the amount of current flowing through the first transistor T1 may be determined in accordance with the voltage stored in the capacitor Cst1.

The first sub-light emitting element S_ED1 may be electrically connected to the sixth transistor T6 and a source power line. The anode electrode of the first sub-light emitting element S_ED1 is connected to the sixth transistor T6, and a cathode electrode of the first sub-light emitting element S_ED1 may be connected to the source power line to receive a source power voltage ELVSS. The source power voltage ELVSS has a lower level than the driving power voltage ELVDD. Therefore, the first sub-light emitting element S_ED1 may emit light according to a voltage in correspondence to the difference between a signal transmitted through the sixth transistor T6 and the source power voltage ELVSS.

FIG. 4A illustrates, as an example of the inventive concept, a structure in which the first sub-pixel driving circuit S_PD1 includes seven transistors T1 to T7 and one capacitor Cst1, but the embodiment of the inventive concept is not limited thereto. The first sub-pixel driving circuit S_PD1 may have various circuit configurations other than the circuit configuration illustrated in FIG. 4A.

Referring to FIG. 4B, the second sub-pixel S_PX2 according to an embodiment of the inventive concept may include the second sub-pixel driving circuit S_PD2 and the second sub-light emitting element S_ED2. The second sub-pixel driving circuit S_PD2 includes a plurality of transistors T1a and T2a and the capacitor Cst2. As an example of the inventive concept, the second sub-pixel driving circuit S_PD2 includes two transistors T1 and T2 and one capacitor Cst2.

A first electrode of a first transistor T1a receives the driving power voltage ELVDD, and a second electrode of the first transistor T1a is connected to an anode electrode of the second sub-light emitting element S_ED2. The first transistor T1a may control the amount of current flowing in the second sub-light emitting element S_ED2 in correspondence to a voltage applied to a control electrode of the first transistor T1a.

The second transistor T2a is connected between a data line DLb and the control electrode of the first transistor T1a. Specifically, the second transistor T2 includes a first electrode connected to the data line DLb, a control electrode connected to the first scan line GWL, and a second electrode connected to the control electrode of the first transistor T1a. When a first scan signal is provided to the first scan line GWL, the second transistor T2a is turned on to electrically connect the data line DLb and the control electrode of the first transistor T1a.

The capacitor Cst2 is disposed between a driving power line and a node NA. The capacitor Cst2 stores a voltage corresponding to a data signal. The amount of current flowing through the first transistor T1a may be determined in accordance with the voltage stored in the capacitor Cst2.

The anode electrode of the second sub-light emitting element S_ED2 is connected to the first transistor T1a, and a cathode electrode of the second sub-light emitting element S_ED2 may be connected to a source power line to receive a source power voltage ELVSS. The source power voltage ELVSS has a lower level than the driving power voltage ELVDD. Therefore, the second sub-light emitting element S_ED2 may emit light according to a voltage in correspondence to the difference between a signal transmitted through the first transistor T1 and the source power voltage ELVSS.

Referring to FIG. 3A, FIG. 4A, FIG. 4B, and FIG. 5A, the second driving driver GDC2 may include a scan driver SDC configured to output scan signals and a light emission driver EDC configured to output a light emission control signal. FIG. 5A exemplarily illustrates four signal lines among signal lines for driving pixels disposed in one pixel row of the display panel DP. The four signal lines may be the first scan line GWL, the second scan line GIL, the third scan line GBL, and the light emission control line EL. However, the signal lines for driving pixels may further include the initialization voltage line VIL, a driving power line, and source power lines other than the above-described lines. Here, the first to third scan lines GWL, GIL, and GBL are connected to the scan driver SDC, and the light emission control line EL is connected to the light emission driver EDC.

Each of the main pixel driving circuits M_PD of the main pixels M_PX disposed in each pixel row and the first sub-pixel driving circuits S_PD1 of the first sub-pixels S_PX1 have the circuit configuration illustrated in FIG. 4A, and thus, may be electrically connected to the first scan line GWL, the second scan line GIL, the third scan line GBL, and the light emission control line EL. However, the second sub-pixel driving circuits S_PD2 of the second sub-pixels S_PX2 disposed in each pixel row have the circuit configuration illustrated in FIG. 4B, and thus, are electrically connected to the first scan line GWL, but are not electrically connected to the second scan line GIL, the third scan line GBL, and the light emission control line EL. Therefore, the second scan line GIL, the third scan line GBL, and the light emission control line EL may bypass the second sub-pixel driving circuits S_PD2.

As illustrated in FIG. 3B, FIG. 4A, and FIG. 4B, the number of transistors included in the second sub-pixel driving circuits S_PD2 may be smaller than the number of transistors included in the first sub-pixel driving circuits S_PD1. Therefore, the second sub-pixel driving circuits S_PD2 may have a smaller width or size than those of the first sub-pixel driving circuits S_PD1, and as a result, it is possible to intensively dispose the second sub-pixel driving circuits S_PD2 in the non-driving region NGDA having a limited size.

Referring to FIG. 4C, the second sub-pixel S_PX2' according to an embodiment of the inventive concept may include the second sub-pixel driving circuit S_PD2' and the second sub-light emitting element S_ED2. The second sub-pixel driving circuit S_PD2' includes a plurality of transistors T1a, T2a, and T3a and capacitors Cst3 and CP. As an example of the inventive concept, the second sub-pixel driving circuit S_PD2' includes three transistors T1a, T2a, and T3a and two capacitors Cst3 and CP.

A first electrode of a first transistor T1a receives the driving power voltage ELVDD, and a second electrode of the first transistor T1a is connected to the anode electrode of the second sub-light emitting element S_ED2. A control electrode of the first transistor T1a is connected to a node NB.

A first capacitor Cst3 is disposed between the initialization voltage line VIL and the node NB. An initialization voltage Vint is applied to the initialization voltage line VIL.

A second transistor T2a is disposed between the data line DLb and the control electrode of the first transistor T1a, and is connected to the data line DLb via a second capacitor CP. Specifically, the second transistor T2a includes a first electrode connected to the second capacitor CP, a control electrode connected to the first scan line GWL, and a second electrode connected to the node NB. When a first scan signal is provided to the first scan line GWL, the second transistor T2a is turned on, and through the turned-on second transistor T2a, the data line DLb and the control electrode of the first transistor T1a are electrically connected.

The second capacitor CP is connected between the first electrode of the second transistor T2a and the data line DLb.

A third transistor T3a is connected between the second transistor T2a and the first transistor T1a. Specifically, the third transistor T3a includes a first electrode connected to the second electrode of the first transistor T1a, a control electrode connected to the initialization voltage line VIL, and a second electrode connected to the first electrode of the second transistor T2a.

When the second transistor T2a is turned on in response to the first scan signal, through the turned-on second transistor T2a, a data voltage is applied to the node NB. When the voltage of the node NB is changed by the data voltage, the third transistor T3a is turned on by the coupling of the first capacitor Cst3. When the second and third transistors T2a and T3a are turned on, the first transistor T1a function as a diode. The driving power voltage ELVDD is provided to the anode electrode of the second sub-light emitting element S_ED2 through the turned-on first transistor T1a. Therefore, the second sub-light emitting element S_ED2 may emit light according to a voltage in correspondence to the difference between a signal transmitted through the first transistor T1 and the source power voltage ELVSS.

Referring to FIG. 4D, the second sub-pixel S_PX2" according to an embodiment of the inventive concept may include the second sub-pixel driving circuit S_PD2" and the second sub-light emitting element S_ED2. The second sub-pixel driving circuit S_PD2" includes a plurality of transistors T1a, T2a, T4a, and T5a and the capacitor Cst4. As an example of the inventive concept, the second sub-pixel driving circuit S_PD2" includes four transistors T1a, T2a, T4a, and T5a and one capacitor Cst4.

A first electrode of a first transistor T1a may receive the driving power voltage ELVDD via a fifth transistor T5a. A second electrode of the first transistor T1a is connected to the anode electrode of the second sub-light emitting element S_ED2. The capacitor Cst4 is connected between a control electrode of the first transistor T1a and the second electrode of the first transistor T1a.

A second transistor T2a is connected between the data line DLb and the control electrode of the first transistor T1a. Specifically, the second transistor T2a includes a first electrode connected to the data line DLb, a control electrode connected to the first scan line GWL, and a second electrode connected to a node NC. When a first scan signal is provided to the first scan line GWL, the second transistor T2a is turned on to electrically connect the data line DLb and the control electrode of the first transistor T1a.

A fourth transistor T4a is connected between the first transistor T1a and the initialization voltage line VIL. A control electrode of the fourth transistor T4a is connected to the second scan line GIL. When a second scan signal is provided to the second scan line GIL, the fourth transistor T4a is turned on to provide the initialization voltage Vint to the second electrode of the first transistor T1a (that is, the anode electrode of the second sub-light emitting element S-ED2). Here, the second scan signal may be a signal generated prior to the first scan signal. For example, the second scan signal may be the same signal as a signal applied to the first scan line GWL of a pixel in a previous row.

A fifth transistor T5a is connected between a driving power line and the first electrode of the first transistor T1a. A control electrode of the fifth transistor T5a is connected to the light emission control line EL.

Referring to FIG. 3A, FIG. 4A, FIG. 4D, and FIG. 5B, the main pixel driving circuits M_PD of the main pixels M_PX disposed in each pixel row and the first sub-pixel driving circuits S_PD1 of the first sub-pixels S_PX1 have the circuit configuration illustrated in FIG. 4A, and thus, may be electrically connected to the first scan line GWL, the second scan line GIL, the third scan line GBL, and the light emission control line EL. However, the second sub-pixel driving circuits S_PD2" of the second sub-pixels S_PX2" disposed in each pixel row have the circuit configuration illustrated in FIG. 4D, and thus, are electrically connected to the first and second scan lines GWL and GIL and the light emission control line EL, but are not electrically connected to the third scan line GBL. Therefore, the third scan line GBL may bypass the second sub-pixel driving circuits S_PD2.

In addition to the circuit structure illustrated in FIG. 4B and FIG. 4D, the second sub-pixel driving circuit S_PD2 or S_PD2" may have various circuit structures as long as it includes the smaller number of transistors than the number of transistors included in the first sub-pixel driving circuit S_PD1. Therefore, the second sub-pixel driving circuits S_PD2 or S_PD2" may have a smaller size than that of the first sub-pixel driving circuits S_PD1, and as a result, it is possible to intensively dispose the second sub-pixel driving circuits S_PD2 in the non-driving region NGDA having a limited size.

Since it is possible to intensively dispose the second sub-pixel driving circuits S_PD2 in the non-driving region NGDA, it is possible to prevent a phenomenon in which the resolution in the second display region DA2 is decreased compared to the resolution in the first display region DA1. In addition, when the resolution in the second display region DA2 is lower than the resolution in the first display region DA1, in order to compensate for the difference in luminance between the first and second display regions DA1 and DA2, the amount of driving current of the first and second sub-pixels S_PX1 and S_PX2 may be increased compared to the amount of driving current of the main pixels M_PX. In this case, the lifespan of the first and second sub-pixels S_PX1 and S_PX2 may decrease. However, in an embodiment according to the inventive concept, the resolution of the second display region DA2 and the difference in luminance between the first and second display regions DA1 and DA2 are improved, so that it is possible to solve the lifespan deterioration problem of the first and second sub-pixels S_PX1 and S_PX2.

Figure 6A:
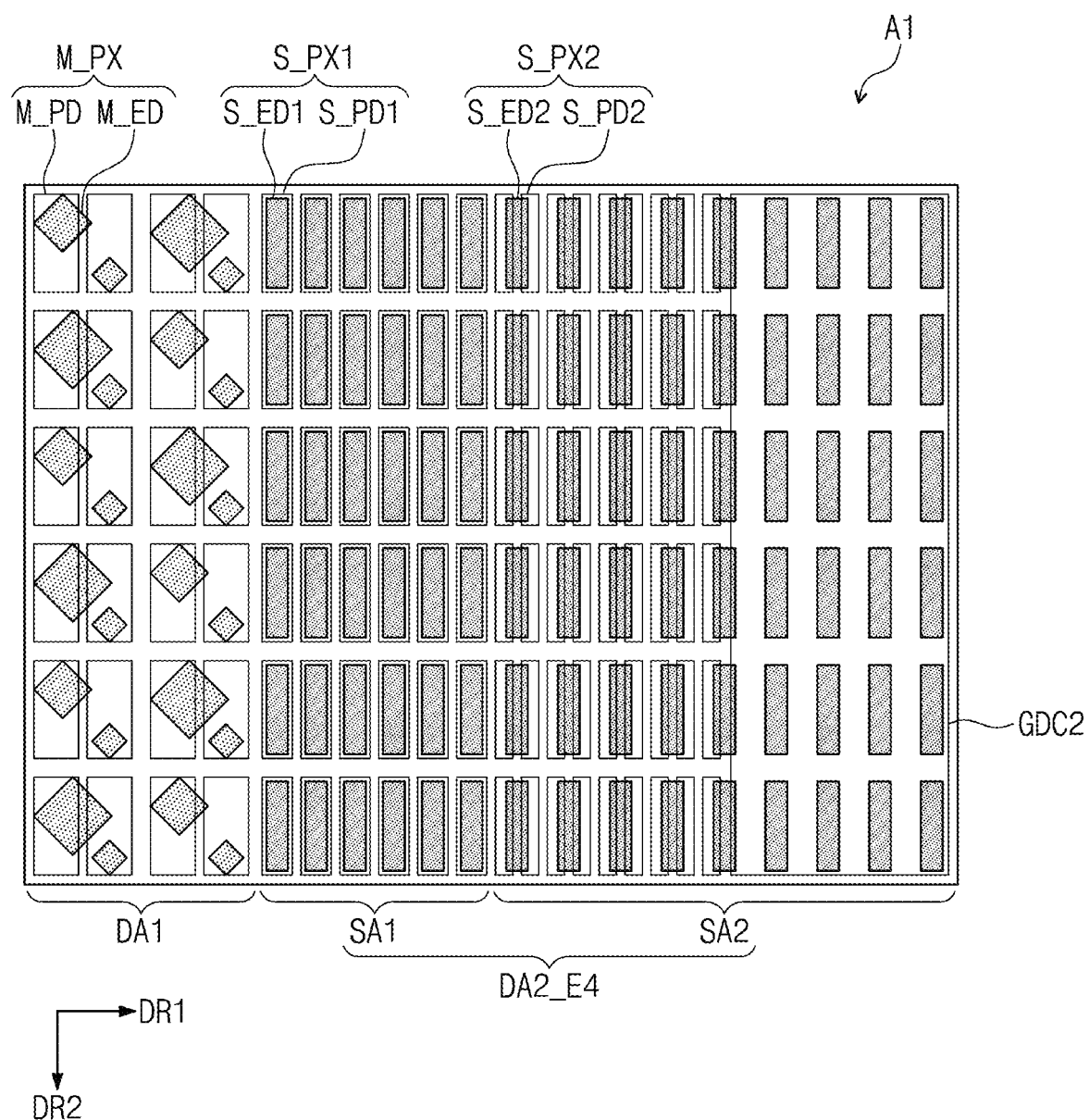
FIG. 6A is an enlarged plan view of region A1 illustrated in FIG. 2B according to another embodiment of the inventive concept.
Figure 6B:
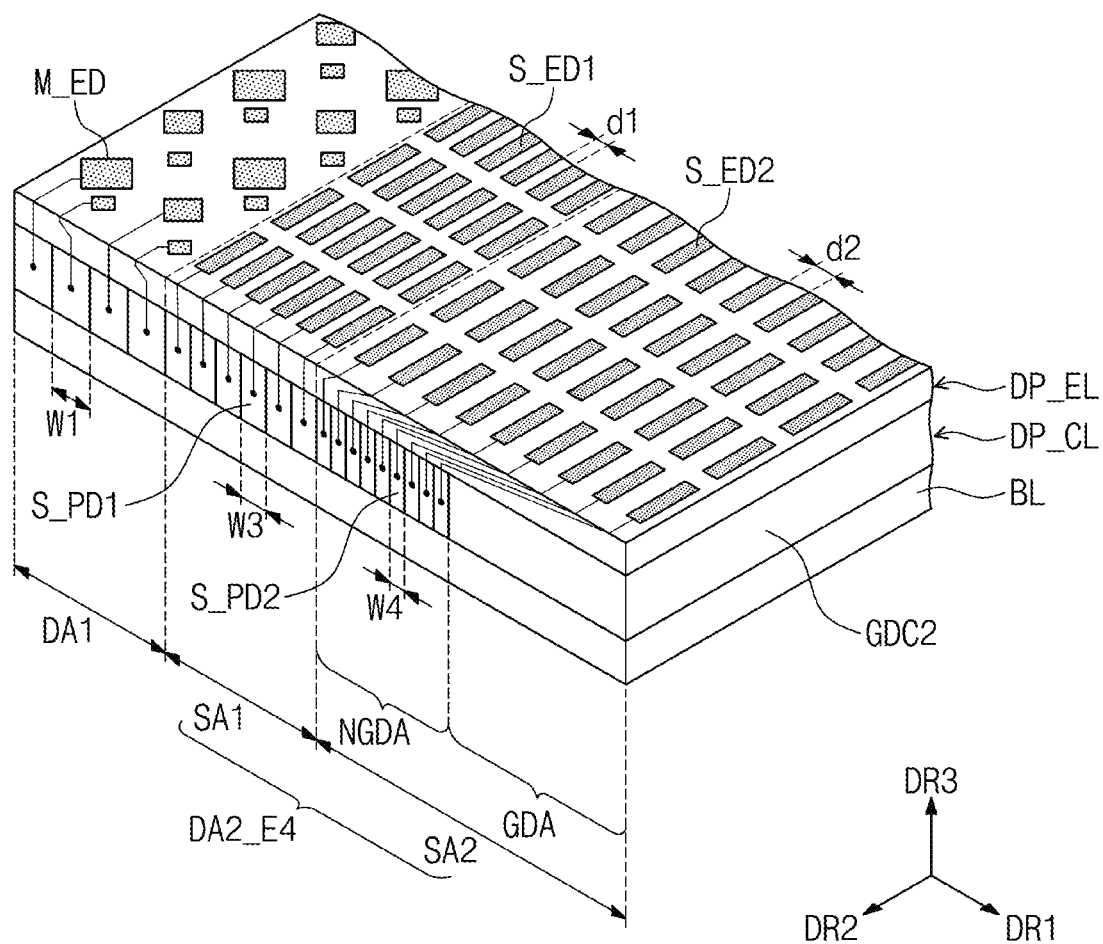
FIG. 6B is an enlarged perspective view of region A1 illustrated in FIG. 2B according to another embodiment of the inventive concept.

FIG. 6A is an enlarged plan view of region A1 illustrated in FIG. 2B according to another embodiment of the inventive concept, and FIG. 6B is an enlarged perspective view of region A1 illustrated in FIG. 2B according to another embodiment of the inventive concept.

Referring to FIG. 6A to FIG. 6B, in the first display region DA1 of the display panel DP, the main pixels M_PX are disposed. The main pixels M_PX may include a plurality of red pixels, a plurality of green pixels, and a plurality of blue pixels. Each main pixel M_PX includes the main pixel driving circuit M_PD and the main light emitting element M_ED. In the first display region DA1, pixels which display different colors among the main pixels M_PX may have different sizes or different shapes.

The fourth edge display region DA2_E4 of the second display region DA2 may include the first and second sub-regions SA1 and SA2. In the first sub-region SA1 of the display panel DP, the first sub-pixels S_PX1 are disposed, and in the second sub-region SA2 of the display panel DP, the second sub-pixels S_PX2 are disposed. The first sub-pixels S_PX1 may include a plurality of red pixels, a plurality of green pixels, and a plurality of blue pixels. Each first sub-pixel S_PX1 may include the first sub-pixel driving circuit S_PD1 and the first sub-light emitting element S_ED1. The second sub-pixels S_PX2 may include a plurality of red pixels, a plurality of green pixels, and a plurality of blue pixels. Each second sub-pixel S_PX2 includes the second sub-pixel driving circuit S_PD2 and the second sub-light emitting element S_ED2.

The first sub-pixels S_PX1 disposed in the first sub-region SA1 of the fourth edge display region DA2_E4 may have a different pixel structure from that of the main pixels M_PX disposed in the first display region DA1. Therefore, the resolution of the first display region DA1 and the resolution of the second display region DA2 may be different from each other.

Particularly, the first sub-pixel driving circuit S_PD1 and the main pixel driving circuit M_PD may have different circuit structures. For example, the number of transistors included in the first sub-pixel driving circuit S_PD1 and the number of transistors included in the main pixel driving circuit M_PD may be different from each other. In addition, when the first sub-light emitting element S_ED1 and the main light emitting element M_ED emitting the same color are compared, the first sub-light emitting element S_ED1 and the main light emitting element M_ED may have different sizes or different shapes. For example, while the light emitting element M_ED has a rhombic shape in a plan view, the first sub-light emitting element S_ED1 may have a rectangular shape in a plan view.

The second sub-pixels S_PX2 disposed in the second sub-region SA2 of the fourth edge display region DA2_E4 may have a different pixel structure from that of the main pixels M_PX disposed in the first display region DA1. In addition, the second sub-pixels S_PX2 may have a different pixel structure from that of the first sub-pixels S_PX1 disposed in the first sub-region SA1. Particularly, the second sub-pixel driving circuit S_PD2 may have a different circuit structure from that of the main pixel driving circuit M_PD and a different circuit structure from that of the first sub-pixel driving circuit S_PD1. For example, the number of transistors included in the second sub-pixel driving circuit S_PD2 may be smaller than the number of transistors included in the first sub-pixel driving circuit S_PD1. Therefore, the width or size of the second sub-pixel driving circuit S_PD2 may be smaller than the width or size of the first sub-pixel driving circuit S_PD1. The second sub-pixel driving circuits S_PD2 of the second sub-pixels S_PX2 disposed in the second sub-region SA2 may not overlap the second driving driver GDC2 in a plan view.

When the second sub-light emitting element S_ED2 and the main light emitting element M_ED emitting the same color are compared, the second sub-light emitting element S_ED2 and the main light emitting element M_ED may have different sizes or different shapes. In addition, when the second sub-light emitting element S_ED2 and the first sub-light emitting element S_ED1 emitting the same color are compared, the second sub-light emitting element S_ED2 and the first sub-light emitting element S_ED1 may have the same size and the same shape.

Some of the second sub-light emitting elements S_ED2 of the second sub-pixels S_PX2 may not overlap the second driving driver GDC2 in a plan view, and some of the second sub-light emitting elements S_ED2 may overlap the second driving driver GDC2 in a plan view. That is, some of the second sub-light emitting elements S_ED2 of the second sub-pixels S_PX2 may be disposed on the second sub-pixel driving circuits S_PD2, and some of the second sub-light emitting elements S_ED2 may be disposed on the second driving driver GDC2 in a plan view.

Referring to FIG. 6B, the main pixel driving circuits M_PD have the first width W1 in the first direction DR1, and the first sub-pixel driving circuits S_PD1 have a third width W3 in the first direction DR1. Here, the third width W3 may be smaller than the first width W1. In addition, second sub-pixel driving circuits S_PD2 have a fourth width W4 in the first direction DR1. Here, the fourth width W4 may be smaller than each of the first and third widths W1 and W3.

The display element layer DP_EL includes the main pixel light emitting elements M_ED and the first and second sub-light emitting elements S_ED1 and S_ED2. The display element layer DP_EL may overlap the second driving driver GDC2 in a plan view. Some of the sub-light emitting elements S_ED2 disposed in the display element layer DP_EL may overlap the second driving driver GDC2. Therefore, an image may be displayed by the second sub-light emitting elements S_ED2 even in the driving region GDA in which the second driving driver GDC2 is disposed in the second sub-region SA2.

The second sub-pixel driving circuits S_PD2 configured to drive the second sub-light emitting elements S_ED2 of the second sub-region SA2 are disposed in the non-driving region NGDA in which the second driving driver GDC2 is not disposed. In order to intensively dispose the second sub-pixel driving circuits S_PD2 in the non-driving region NGDA having a limited size, each of the second sub-pixel driving circuits S_PD2 may have a width, size, or area smaller than those of each first sub-pixel driving circuit S_PD1. To this end, the number of transistors included in each of the second sub-pixel driving circuits S_PD2 may be smaller than the number of transistors included in each of the first sub-pixel driving circuits S_PD1.

As an example of the inventive concept, the density of the first sub-light emitting elements S_ED1 per unit area in the first sub-region SA1 may be different from the density of the second sub-light emitting elements S_ED2 per unit area in the second sub-region SA2. In an embodiment, the density of the second sub-light emitting elements S_ED2 may be lower than the density of the first sub-light emitting elements S_ED1 (See FIGS. 6A and 6B).

As an example of the inventive concept, in the first sub-region SA1, the first sub-light emitting elements S_ED1 may be disposed at a first interval d1 in the first direction DR1, and the second sub-light emitting elements S_ED2 of the second sub-region SA2 may be disposed at a second interval d2 in the first direction DR1. Here, the second interval d2 may be larger than the first interval d1.

In FIG. 6A and FIG. 6B, the fourth edge display region DA2_E4 is described as an example, but the embodiment of the inventive concept is not limited thereto. In another embodiment, in the first to fourth edge display regions DA2_E1 to DA2_E4 (see FIG. 2B), the density of the first sub-light emitting elements S_ED1 and the density of the second sub-light emitting elements S_ED2 may be the same. In addition, in the first to fourth corner display regions DA2_C1 to DA2_C4 (see FIG. 2B), the density of the first sub-light emitting elements S_ED1 and the density of the second sub-light emitting elements S_ED2 may be different from each other.

As another example of the inventive concept, the density of the second sub-light emitting elements S_ED2 in the first to fourth corner display regions DA2_C1 to DA2_C4 may vary depending on the distance from the first display region DA1. In an embodiment, the density of the second sub-light emitting elements S_ED2 in the first to fourth corner display regions DA2_C1 to DA2_C4 may decrease as the distance thereof from the first display region DA1 increases.

Figure 7A:
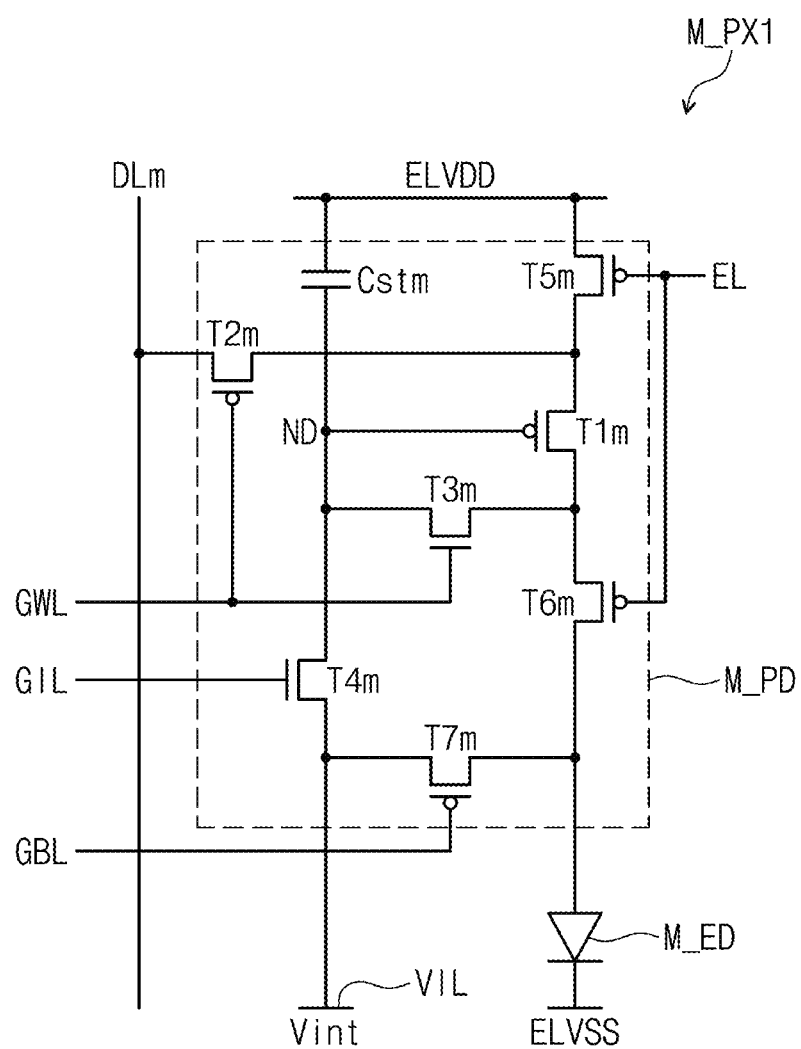
FIG. 7A is an equivalent circuit diagram of a main pixel according to an embodiment of the inventive concept.
Figure 7B:
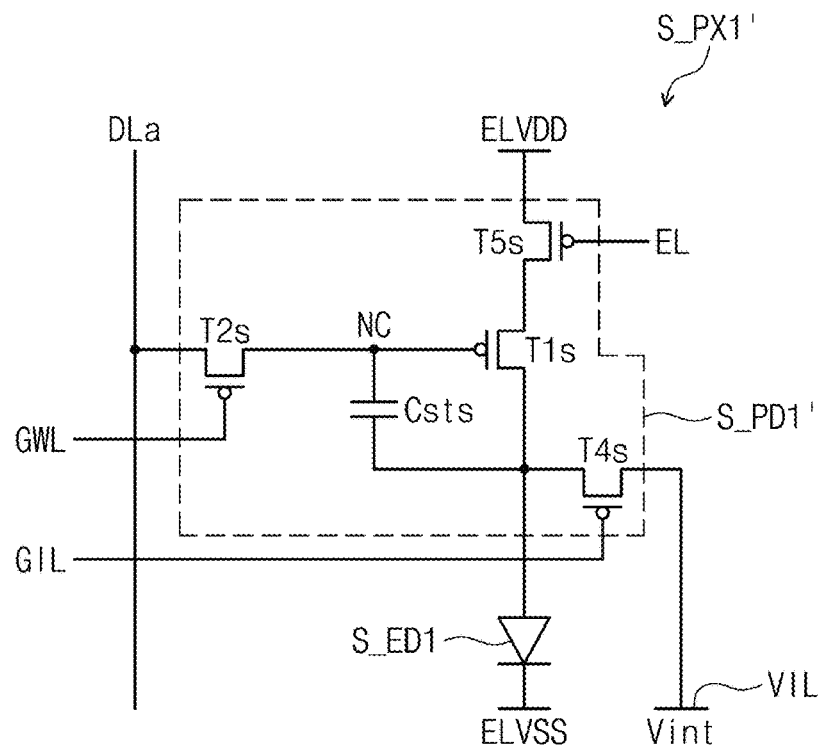
FIG. 7B is an equivalent circuit diagram of a first sub-pixel according to another embodiment of the inventive concept.
Figure 7C:
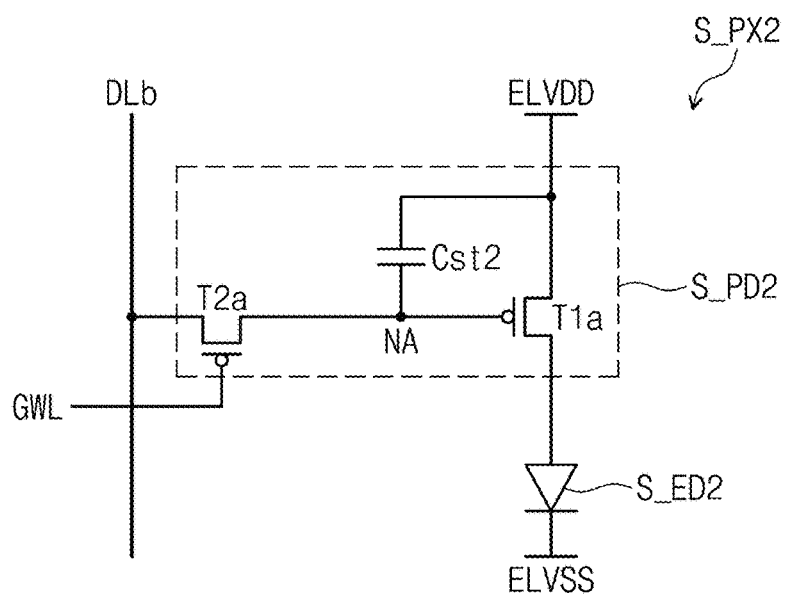
FIG. 7C is an equivalent circuit diagram of a second sub-pixel according to an embodiment of the inventive concept.
Figure 8:
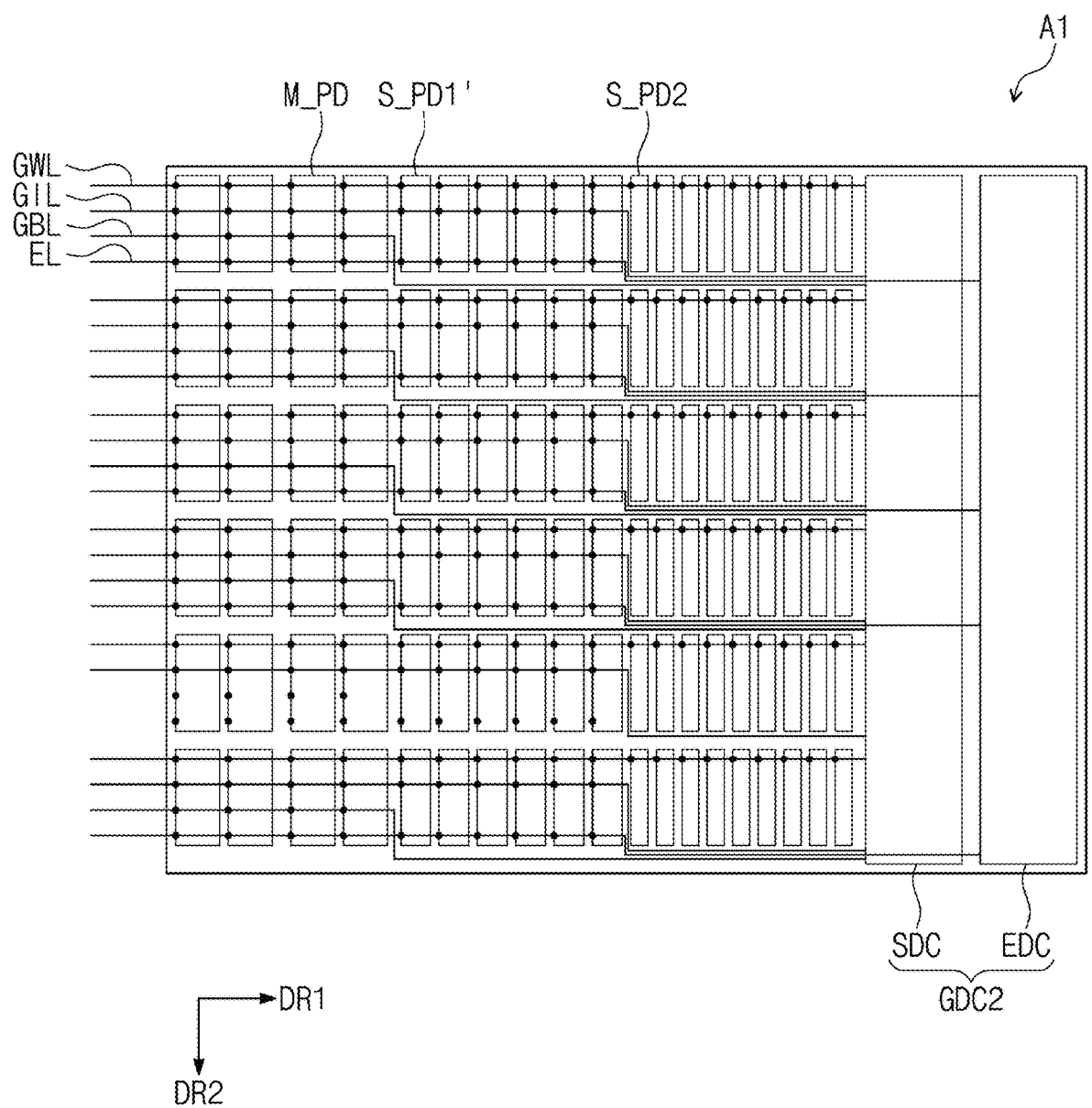
FIG. 8 is a plan view showing the connection relationship among main pixels, first sub-pixels, second sub-pixels, and signal lines according to another embodiment of the inventive concept.

FIG. 7A is an equivalent circuit diagram of a main pixel according to an embodiment of the inventive concept. FIG. 7B is an equivalent circuit diagram of a first sub-pixel according to another embodiment of the inventive concept. FIG. 7C is an equivalent circuit diagram of a second sub-pixel according to an embodiment of the inventive concept. FIG. 8 is a plan view showing the connection relationship among a main pixel, a first sub-pixel, a second sub-pixel, and signal lines according to another embodiment of the inventive concept.

Referring to FIG. 7A, the main pixel M_PX according to an embodiment of the inventive concept may include the main pixel driving circuit M_PD and the main light emitting element M_ED. The main pixel driving circuit M_PD includes a plurality of transistors T1m to T7m and the capacitor Cstm. The plurality of transistors T1m to T7m and the capacitor Cstm may control the amount of current flowing in the main light emitting element M_ED in response to a data signal and a scan signal.

As an example of the inventive concept, the main pixel driving circuit M_PD includes seven transistors T1m to T7m and one capacitor Cstm. The main pixel driving circuit M_PD has the same circuit structure as that of the first sub-pixel driving circuit S_PD1 illustrated in FIG. 4A. Therefore, a detailed description of the main pixel driving circuit M_PD will be omitted.

Referring to FIG. 7B, the first sub-pixel S_PX1' according to another embodiment of the inventive concept may include the first sub-pixel driving circuit S_PD1' and the first sub-light emitting element S_ED1. The first sub-pixel driving circuit S_PD1 includes a plurality of transistors T1s, T2s, T4s, and T5s and the capacitor Csts. As an example of the inventive concept, the first sub-pixel driving circuit S_PD1 includes four transistors T1s, T2s, T4s, and T5s and one capacitor Csts. That is, the first sub-pixel driving circuit S_PD1 includes a smaller number of transistors than that of the main pixel driving circuit M_PD.

Here, the first sub-pixel driving circuit S_PD1 has the same circuit structure as that of the second sub-pixel driving circuit S_PD2 illustrated in FIG. 4D. Therefore, a detailed description of the first sub-pixel driving circuit S_PD1 will be omitted.

Referring to FIG. 7C, the second sub-pixel S_PX2 according to an embodiment of the inventive concept may include the second sub-pixel driving circuit S_PD2 and the second sub-light emitting element S_ED2. The second sub-pixel driving circuit S_PD2 includes a plurality of transistors T1a and T2a and the capacitor Cst2. As an example of the inventive concept, the second sub-pixel driving circuit S_PD2 includes two transistors T1a and T2a and one capacitor Cst2. That is, the second sub-pixel driving circuit S_PD2 includes a smaller number of transistors than that of the first sub-pixel driving circuit S_PD1.

Here, the second sub-pixel driving circuit S_PD2 has the same circuit structure as that of the second sub-pixel driving circuit S_PD2 illustrated in FIG. 4B. Therefore, a detailed description of the second sub-pixel driving circuit S_PD2 will be omitted.

Referring to FIG. 6A, FIG. 7A to FIG. 7C, and FIG. 8, the second driving driver GDC2 may include the scan driver SDC configured to output scan signals and the light emission driver EDC configured to output a light emission control signal. FIG. 8 exemplarily illustrates four signal lines among signal lines for driving pixels disposed in one pixel row of the display panel DP. The four signal lines may be the first scan line GWL, the second scan line GIL, the third scan line GBL, and the light emission control line EL. However, the signal lines for driving pixels further include the initialization voltage line VIL, a driving power line, and source power lines other than the above-described lines. Here, the first to third scan lines GWL, GIL, and GBL are connected to the scan driver SDC, and the light emission control line EL is connected to the light emission driver EDC.

The main pixel driving circuits M_PD of the main pixels M_PX disposed in each pixel row have the circuit configuration illustrated in FIG. 7A, and thus, may be electrically connected to the first scan line GWL, the second scan line GIL, the third scan line GBL, and the light emission control line EL. However, the first sub-pixel driving circuits S_PD1' of the first sub-pixels S_PX1' disposed in each pixel row have the circuit configuration illustrated in FIG. 7B, and thus, are electrically connected to the first scan line GWL, the second scan lines GIL, and the light emission control line EL, but are not electrically connected to the third scan line GBL. Therefore, the third scan line GBL may be disposed by bypassing the first sub-pixel driving circuits S_PD1.

In addition, the second sub-pixel driving circuits S_PD2 of the second sub-pixels S_PX2 disposed in each pixel row have the circuit configuration illustrated in FIG. 7C, and thus, are electrically connected to the first scan line GWL, but are not electrically connected to the second scan line GIL, the third scan line GBL, and the light emission control line EL. Therefore, the second scan line GIL, the third scan line GBL, and the light emission control line EL may be disposed by bypassing the second sub-pixel driving circuits S_PD2.

As illustrated in FIG. 6B and FIG. 7A to FIG. 7C, the number of transistors included in the first and second sub-pixel driving circuits S_PD1 and S_PD2 may be smaller than the number of transistors included in the main pixel driving circuit M_PD. Therefore, each of the first and second sub-pixel driving circuits S_PD1' and S_PD2 may have a smaller width or size than those of the main pixel driving circuit M_PD. As a result, it is possible to intensively dispose the first and second sub-pixel driving circuits S_PD1' and S_PD2 in the second display region DA2 (see FIG. 2A) having a limited size.

According to an embodiment of the inventive concept, an edge portion and a corner portion of a display device become a display region capable of displaying an image, so that it is possible to provide a display device having an enlarged display region.

In addition, the limitation in which resolution is deteriorated in the edge portion and the corner portion due to a driving driver is solved, so that it is possible to improve the display quality of an edge display region and a corner display region. Since the resolution of the edge portion and the corner portion is increased, the luminance difference between a first display region and a second display region is reduced, and furthermore, it is possible to solve the limitation in which the lifespan of pixels disposed in the edge portion and the corner portion is deteriorated.

Although the inventive concept has been described with reference embodiments of the inventive concept, it will be understood by those skilled in the art that various modifications and changes in form and details may be made therein without departing from the spirit and scope of the inventive concept as set forth in the following claims. In addition, the embodiments disclosed in the inventive concept are not intended to limit the technical spirit of the inventive concept, and all technical concepts falling within the scope of the following claims and equivalents thereof are to be construed as being included in the scope of the inventive concept.

What is claimed is:

1. A display device comprising
a display panel in which a first display region and a second display region adjacent to the first display region are defined, wherein the display panel comprises:
   main pixels disposed in the first display region;
   first sub-pixels disposed in a first sub-region of the second display region; and
   second sub-pixels disposed in a second sub-region of the second display region,
   wherein the first sub-region is disposed between the first display region and the second sub region,
wherein each of the main pixels comprises:
   a main pixel driving circuit; and
   a main light emitting element electrically connected to the main pixel driving circuit,
each of the first sub-pixels comprises:
   a first sub-pixel driving circuit; and
   a first sub-light emitting element electrically connected to the first sub-pixel driving circuit, and
each of the second sub-pixels comprises:
   a second sub-pixel driving circuit; and
   a second sub-light emitting element electrically connected to the second sub-pixel driving circuit,
wherein at least one of the first sub-pixel driving circuit and the second sub-pixel driving circuit have different pixel structures from the main driving circuit.

2. The display device of claim 1, wherein the display panel further comprises a driving driver disposed in the second display region and which drives the main pixels and the first and second sub-pixels,
wherein the second sub-region partially overlaps the driving driver in a plan view.

3. The display device of claim 2,
wherein the first sub-pixel driving circuit and the second sub-pixel driving circuit have different pixel structures from each other.

4. The display device of claim 3, wherein number of transistors included in the first sub-pixel driving circuit and number of transistors included in the second sub-pixel driving circuit are different from each other.

5. The display device of claim 4, wherein the number of transistors included in the second sub-pixel driving circuit is smaller than the number of transistors included in the first sub-pixel driving circuit.

6. The display device of claim 3, wherein the second sub-region comprises:
   a non-driving region in which the second sub-pixel driving circuits of the second sub-pixels are disposed; and
   a driving region in which the driving driver is disposed,
   wherein some of the second sub-light emitting elements of the second sub-pixels overlap the driving region, and rest of the second sub-light emitting elements excluding the some of the second sub-light emitting elements overlap the non-driving region in the plan view.

7. The display device of claim 3, wherein the display panel further comprises n number of signal lines connected to the main pixels and the first sub-pixels,
   wherein some signal lines among the n number of signal lines are electrically connected to the second sub-pixels, and the other signal lines among the n number of signal lines excluding the some signal lines are not electrically connected to the second sub-pixels.

8. The display device of claim 1,
wherein the first sub-pixel driving circuit has a same circuit structure as the main pixel driving circuit, and the second sub-pixel driving circuit has a different circuit structure from the main pixel driving circuit.

9. The display device of claim 8, wherein when the first sub-light emitting element and the second sub-light emitting element emit light having substantially a same color, the first sub-light emitting element and the second sub-light emitting element have same size and shape.

10. The display device of claim 1, wherein density of the first sub-light emitting elements per unit area is different from density of the second sub-light emitting elements per unit area.

11. The display device of claim 10,
wherein the first and second sub-pixel driving circuits have a different circuit structure from the main pixel driving circuit.

12. The display device of claim 10, wherein when the first sub-light emitting element and the second sub-light emitting element emit light having substantially a same color, the first sub-light emitting element and the second sub-light emitting element have different sizes and shapes.

13. The display device of claim 1, wherein the second display region comprises:
   an edge display region extended from a side of the first display region; and
   a corner display region extended from a corner of the first display region.

14. The display device of claim 13, wherein the display panel further comprises a driving driver disposed in the edge display region and the corner display region and which drives the main pixels and the first and second sub-pixels,
   wherein the driving driver is disposed adjacent to an outer side edge of the edge display region in the edge display region, and is disposed adjacent to a boundary with the first display region in the corner display region.

15. The display device of claim 13, wherein the edge display region comprises the first and second sub-regions, and the corner display region comprises the first and second sub-regions.

16. A display device comprising:
a display panel in which a first display region and a second display region adjacent to the first display region are defined, wherein the display panel comprises:
   main pixels disposed in the first display region;
   first sub-pixels disposed in a first sub-region of the second display region and each including a first sub-pixel driving circuit and a first sub-light emitting element electrically connected to the first sub-pixel driving circuit; and
   second sub-pixels disposed in a second sub-region of the second display region and each including a second sub-pixel driving circuit and a second sub-light emitting element electrically connected to the second sub-pixel driving circuit,
   wherein the first sub-pixel driving circuit and the second sub-pixel driving circuit have different pixel structures.

17. The display device of claim 16, wherein the display panel further comprises a driving driver disposed in the second display region and which drives the main pixels and the first and second sub-pixels,
   wherein the second sub-region partially overlaps the driving driver in a plan view.

18. The display device of claim 17, wherein the second sub-region comprises:
   a non-driving region in which the second sub-pixel driving circuits of the second sub-pixels are disposed; and a driving region in which the driving driver is disposed,
wherein some of the second sub-light emitting elements of the second sub-pixels overlap the driving region, and rest of the second sub-light emitting elements excluding the some of the second sub-light emitting elements overlap the non-driving region in the plan view.

19. The display device of claim 16, wherein number of transistors included in the second sub-pixel driving circuit is smaller than number of transistors included in the first sub-pixel driving circuit.

20. The display device of claim 16, wherein when the first sub-light emitting element and the second sub-light emitting element emit light having substantially a same color, size and shape of the first sub-light emitting element are the same as size and shape of the second sub-light emitting element.

21. The display device of claim 16, wherein when the first sub-light emitting element and the second sub-light emitting element emit light having substantially a same color, the first sub-light emitting element and the second sub-light emitting element have different sizes and shapes.

22. The display device of claim 16, wherein the second display region comprises:
an edge display region extended from a side of the first display region; and
a corner display region extended from a corner of the first display region.

23. The display device of claim 22, wherein the display panel further comprises a driving driver disposed in the edge display region and the corner display region and which drives the main pixels and the first and second sub-pixels,
wherein the driving driver is disposed adjacent to an outer side edge of the edge display region in the edge display region, and is disposed adjacent to a boundary with the first display region in the corner display region.

* * * * *